US011553118B2

(12) United States Patent
Kimura et al.

(10) Patent No.: US 11,553,118 B2
(45) Date of Patent: Jan. 10, 2023

(54) IMAGING APPARATUS, MANUFACTURING METHOD THEREFOR, AND ELECTRONIC APPARATUS

(71) Applicant: SONY SEMICONDUCTOR SOLUTIONS CORPORATION, Kanagawa (JP)

(72) Inventors: Katsuji Kimura, Kanagawa (JP); Kazumasa Tanida, Kanagawa (JP); Fumihiko Hanzawa, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 351 days.

(21) Appl. No.: 16/625,186

(22) PCT Filed: Jun. 22, 2018

(86) PCT No.: PCT/JP2018/023758
§ 371 (c)(1),
(2) Date: Dec. 20, 2019

(87) PCT Pub. No.: WO2019/009098
PCT Pub. Date: Jan. 10, 2019

(65) Prior Publication Data
US 2020/0145562 A1    May 7, 2020

(30) Foreign Application Priority Data
Jul. 6, 2017 (JP) .............................. JP2017-132696

(51) Int. Cl.
*H04N 5/225* (2006.01)
*H01L 27/146* (2006.01)

(52) U.S. Cl.
CPC ..... *H04N 5/2253* (2013.01); *H01L 27/14618* (2013.01); *H01L 27/14623* (2013.01);
(Continued)

(58) Field of Classification Search
CPC .............. H04N 5/2253; H04N 5/2254; H04N 5/22541; H04N 5/2257; H04N 5/225;
(Continued)

(56) References Cited

U.S. PATENT DOCUMENTS 7,633,542 B2 * 12/2009 Kawai ............... H04N 5/22521
348/335
9,418,193 B2 * 8/2016 Dowski, Jr .......... G02B 3/0068
(Continued)

FOREIGN PATENT DOCUMENTS

JP    2009-170977    7/2009
JP    2010-011230    1/2010
(Continued)

OTHER PUBLICATIONS

International Search Report and Written Opinion prepared by the European Patent Office dated Oct. 5, 2018, for International Application No. PCT/JP2018/023758.

*Primary Examiner* — John R Lee
(74) *Attorney, Agent, or Firm* — Sheridan Ross P.C.

(57) ABSTRACT

An imaging apparatus with reduced flare includes an imaging structure including a solid state imaging element (1) and a transparent substrate (2) disposed on the imaging element. The imaging apparatus includes a circuit substrate (7) including a circuit, a spacer (10) including at least one fixing portion (11) that guides the imaging structure to a desired position on the circuit substrate (7) when the imaging structure is mounted on the circuit substrate, and a light absorbing material (13) disposed on at least one side surface of the imaging structure such that that light absorbing material (13) is between the imaging structure and the at least one fixing portion.

20 Claims, 25 Drawing Sheets

(52) U.S. Cl.
CPC .. *H01L 27/14625* (2013.01); *H01L 27/14634* (2013.01); *H01L 27/14683* (2013.01); *H04N 5/2254* (2013.01)

(58) Field of Classification Search
CPC ............ H01L 27/146; H01L 27/14601; H01L 27/14618; H01L 27/14623; H01L 27/1462; H01L 27/14625; H01L 27/14627; H01L 27/14634; H01L 27/14683; H01L 27/1469
See application file for complete search history.

(56) References Cited

U.S. PATENT DOCUMENTS

| | | | |
|---|---|---|---|
| 9,826,131 | B2* | 11/2017 | Alasirnio ............... H05K 3/284 |
| 2010/0079635 | A1* | 4/2010 | Yano ................. H01L 27/14625 |
| | | | 348/294 |
| 2016/0241749 | A1* | 8/2016 | Alasirnio ............. H04N 5/2252 |
| 2016/0350445 | A1* | 12/2016 | Dowski, Jr ........ H01L 27/14685 |
| 2017/0012069 | A1* | 1/2017 | Rudmann ......... H01L 27/14687 |
| 2018/0013939 | A1* | 1/2018 | Shigemitsu ............. G03B 17/12 |
| 2018/0083056 | A1 | 3/2018 | Seki et al. |
| 2018/0205857 | A1* | 7/2018 | Chan .................. G02B 13/0085 |
| 2020/0098810 | A1* | 3/2020 | Kimura ............. H01L 27/14618 |
| 2020/0145562 | A1* | 5/2020 | Kimura ................ H04N 5/2257 |
| 2020/0209596 | A1* | 7/2020 | Kimura .............. G02B 27/0018 |
| 2020/0292414 | A1* | 9/2020 | Kimura ................ G01R 31/311 |

FOREIGN PATENT DOCUMENTS

| | | |
|---|---|---|
| JP | 2010-161784 | 7/2010 |
| JP | 2011-237633 | 11/2011 |
| JP | 2012-018993 | 1/2012 |
| WO | WO 2007/043509 | 4/2007 |
| WO | WO 2016/056510 | 4/2016 |
| WO | WO 2016/152431 | 9/2016 |

* cited by examiner

IMAGING APPARATUS, MANUFACTURING METHOD THEREFOR, AND ELECTRONIC APPARATUS

CROSS REFERENCE TO RELATED APPLICATIONS

This application is a national stage application under 35 U.S.C. 371 and claims the benefit of PCT Application No. PCT/JP2018/023758 having an international filing date of 22 Jun. 2018, which designated the United States, which PCT application claimed the benefit of Japanese Priority Patent Application No. 2017-132696 filed on 6 Jul. 2017, the disclosures of each of which are incorporated herein by reference in their entirety.

TECHNICAL FIELD

The present disclosure relates to an imaging apparatus, a manufacturing method therefor, and an electronic apparatus, and more particularly, to an imaging apparatus, a manufacturing method therefor, and an electronic apparatus that are capable of suppressing a flare phenomenon due to internal reflection of light in the imaging apparatus and achieving favorable image quality.

BACKGROUND ART

In recent years, in an imaging apparatus such as a camera-equipped mobile terminal apparatus and a digital still camera, the number of pixels in a camera has been increased and the camera has been downsized and thinned. As a general method for the downsizing and thinning, a solid-state imaging element is formed as a CSP (Chip Size Package) type one (see, for example, Patent Literature 1).

CITATION LIST

Patent Literature

PTL 1: WO 2016/056510

SUMMARY OF INVENTION

Technical Problem

However, in the structure disclosed in Patent Literature 1, a flare phenomenon due to internal reflection of light (hereinafter, referred to as diffused reflection of light) in an imaging apparatus reduces the image quality in some cases.

The present disclosure has been made in view of the above circumstances to provide a small-sized and low height imaging apparatus and an imaging apparatus capable of suppressing a flare phenomenon due to diffused reflection of light in the imaging apparatus and achieving favorable image quality by particularly using a CSP-type solid-state imaging element.

Solution to Problem

In accordance with an embodiment of the present disclosure, there is provided an imaging apparatus including an imaging structure. The imaging structure includes an imaging element; and a transparent substrate disposed on the imaging element. The imaging apparatus includes a circuit substrate including a circuit; a spacer including at least one fixing portion that guides the imaging structure to a desired position on the circuit substrate when the imaging structure is mounted on the circuit substrate; and a light absorbing material disposed on at least one side surface of the imaging structure such that that light absorbing material is between the imaging structure and the at least one fixing portion.

The imaging structure further comprises a lens stack including a plurality of lenses; and at least one lens on the transparent substrate and spaced apart from the lens stack. The lens stack and the at least one lens focus received light.

The light absorbing material is disposed on at least one side surface of the at least one lens.

The light absorbing material is disposed on a first end surface of the at least one lens. The first end surface is opposite to a second end surface of the at least one lens, and the second end surface is closer to the transparent substrate than the first end surface.

The first end surface of the at least one lens has a concave shape.

The light absorbing material includes an adhesive that adheres the imaging structure to the at least one fixing portion.

The light absorbing material is disposed on a side surface of the transparent substrate.

The light absorbing material is disposed on a first end surface of the transparent substrate. The first end surface is opposite to a second end surface of the at least one lens, and the second end surface is closer to the circuit substrate than the first end surface.

The transparent substrate is an infrared cut filter.

The imaging structure further comprises an infrared cut filter on the transparent substrate.

The at least one fixing portion includes four fixing portions that guide the imaging structure to the desired position.

The four fixing portions are defined by a cavity in the spacer and have shapes that guide respective corners of the imaging structure to the desired position.

The shapes of the four fixing portions and the respective corners have substantially right angles.

The at least one side surface of the imaging structure includes side surfaces at locations that correspond to the respective corners, and the light absorbing material is disposed on partial portions of the side surfaces at the locations that correspond to the respective corners.

The imaging structure is a cavity structure that includes a cavity between the imaging element and the transparent substrate.

The imaging structure is a cavity-less structure that does not include a cavity between the imaging element and the transparent substrate.

The light absorbing material is disposed on at least one side surface of the at least one lens.

The imaging structure further comprises an infrared cut filter disposed between the lens stack and the at least one lens. The circuit substrate includes one of a connector configured to output a pixel signal output from the imaging element, and an ACF (Anisotropic Conductive Film) terminal.

In accordance with an embodiment of the present disclosure, there is provided a manufacturing method for an imaging apparatus including a CSP solid-state imaging element including a solid-state imaging element configured to photoelectrically convert received light into an electric signal corresponding to an amount of the received light, and a glass substrate configured to fix the solid-state imaging element, the solid-state imaging element and the glass substrate being integrated, a circuit substrate including a circuit configured to externally transfer the photoelectrically converted electric signal, a spacer for fixing the CSP solid-state imaging element and the circuit substrate, a fixing portion configured to guide the CSP solid-state imaging element to a predetermined position on the circuit substrate in a case of mounting the CSP solid-state imaging element, and a light absorbing material having a function of absorbing light, the light absorbing material being provided to cover a side surface of the CSP solid-state imaging element, the spacer including the fixing portion, the manufacturing method including: fixing the CSP solid-state imaging element to the circuit substrate; fixing the spacer to the circuit substrate by fitting the CSP solid-state imaging element into the fixing portion of the spacer, the CSP solid-state imaging element being guided to a predetermined position on the circuit substrate; and providing the light absorbing material to cover a side surface of the CSP solid-state imaging element.

In accordance with an embodiment of the present disclosure, there is provided an electronic apparatus including a control unit and an imaging apparatus. The imaging apparatus includes an imaging structure. The imaging structure includes an imaging element; and a transparent substrate disposed on the imaging element. The imaging apparatus includes a circuit substrate including a circuit; a spacer including at least one fixing portion that guides the imaging structure to a desired position on the circuit substrate when the imaging structure is mounted on the circuit substrate; and a light absorbing material disposed on at least one side surface of the imaging structure such that that light absorbing material is between the imaging structure and the at least one fixing portion.

In an embodiment of the present disclosure, there are provided: a CSP (Chip Size Package) solid-state imaging element including a solid-state imaging element configured to photoelectrically convert received light into an electric signal corresponding to an amount of the received light, and a glass substrate configured to fix the solid-state imaging element, the solid-state imaging element and the glass substrate being integrated; a circuit substrate including a circuit configured to externally transfer the photoelectrically converted electric signal; a spacer for fixing the CSP solid-state imaging element and the circuit substrate; a fixing portion configured to guide the CSP solid-state imaging element to a predetermined position on the circuit substrate in a case of mounting the CSP solid-state imaging element; and a light absorbing material having a function of absorbing light, the light absorbing material being provided to cover a side surface of the CSP solid-state imaging element.

Advantageous Effects of Invention

In accordance with an embodiment of the present disclosure, it is possible to provide a solid-state imaging apparatus capable of achieving favorable image quality by suppressing a flare phenomenon due to diffused reflection of light in the solid-state imaging apparatus, which is likely to occur when using a CSP-type solid-state imaging element.

DESCRIPTION OF EMBODIMENTS

Figure 1:
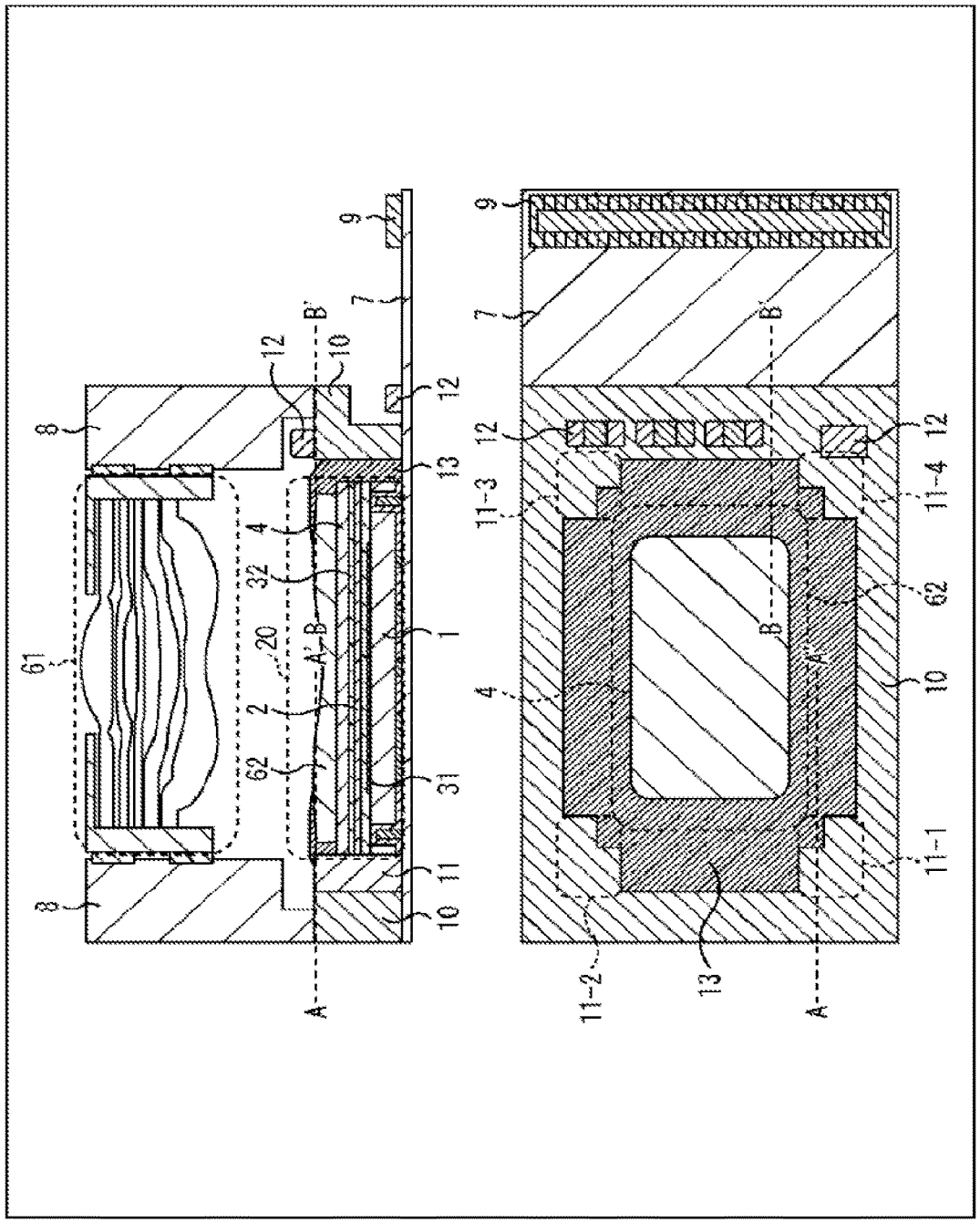
FIG. 1 is a diagram describing a configuration example of an imaging apparatus according to a first embodiment of the present disclosure.

Hereinafter, favorable embodiments of the present disclosure will be described in detail with reference to the accompanying drawings. It should be noted that the components having substantially the same functional configuration will be denoted by the same reference symbols, and duplicate description will be omitted herein and in the drawings.

Further, the description will be given in the following order.
1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Tenth Embodiment
11. Regarding Configuration of CSP Solid-State Imaging Element
12. Example of Application to Electronic Apparatuses
13. Usage Example of Imaging Element
14. Example of Application to Internal Information Acquisition System
15. Example of Application to Endoscopic Operation System
16. Example of Application to Movable Object 1. First Embodiment FIG. 1 is a diagram illustrating a structure of an imaging apparatus to which a solid-state imaging element according to a first embodiment of the present disclosure is applied. An upper part of FIG. 1 is a cross-sectional side view of the imaging apparatus, and a lower part of FIG. 1 is a top view of a cross section taken along the line AB' in the upper part. Note that the left half of the upper part of FIG. 1 illustrates a cross section taken along the line AA' in the lower part, and the right half of the upper part of FIG. 1 illustrates a cross section taken along the line BB' in the lower part.

The imaging apparatus illustrated in FIG. 1 includes a CSP (Chip Size Package) solid-state imaging element 20, a circuit substrate 7, an actuator 8, a spacer 10, and lenses 61 and 62. The lenses in the imaging apparatus illustrated in FIG. 1 are divided into two groups consisting of the lenses 61 and 62, and arranged, in the light transmission direction, from the lens (or lens stack) 61 in the upper layer to the lens 62 in the lowermost layer placed right above a solid-state imaging element 1. The lens 62 may have a concave shape on an upper surface (or end surface) thereof. Although FIG. 1, shows one lens 62, it should be appreciated that the lens 62 may include a plurality of lenses or a plurality of lens layers.

The CSP (Chip Size Package) solid-state imaging element 20 illustrated in FIG. 1 is an imaging element in which the solid-state imaging element 1, a glass substrate (or transparent substrate) 2, an infrared cut filter (or transparent substrate) 4, and the lens 62 are formed as an integrated structure.

In more detail, the solid-state imaging element 1 is, for example, a CCD (Charged Coupled Devices) image sensor or a CMOS (Complementary Metal Oxide Semiconductor) image sensor. The solid-state imaging element 1 generates charges by photoelectrically converting, according to the amount of light, light entering the solid-state imaging element 1 via the lenses 61 and 62, and outputs a pixel signal including an electric signal corresponding thereto. The solid-state imaging element 1 and the glass substrate 2 are adhered to each other by a transparent adhesive 31. The infrared cut filter 4 is a filter for cutting infrared light, and adhered to the glass substrate 2 by a transparent adhesive 32. The lens 62 in the lowermost layer is formed on the infrared cut filter 4.

Since the CSP solid-state imaging element 20 is configured as illustrated in FIG. 1, the CSP solid-state imaging element 20 is treated as one component in an assembly step.

When regarding the two groups including the lenses 61 and 62 as one optical system, the lens 61 constitutes one of the two groups, and includes one or more lenses for condensing object light on the imaging surface of the solid-state imaging element 1.

The actuator 8 has at least one of functions of an auto-focus function and a camera shake correction function, i.e., drives the lens 61 in the vertical direction and the horizontal direction in FIG. 1 with respect to the direction facing the solid-state imaging element 1.

The circuit substrate 7 outputs the electric signal of the CSP solid-state imaging element 20 to the outside. The spacer 10 is fixed by being connected to a fixing agent (or light absorbing material) 13 formed of, for example, black resin that absorbs light from the circuit substrate 7 and the CSP solid-state imaging element 20. Further, the spacer 10 fixes the lens 61 and the actuator 8 by mounting the actuator 8 on the upper surface part thereof illustrated in FIG. 1.

On the circuit substrate 7 and the spacer 10, semiconductor components 12 such as a capacitor and an actuator control LSI (Large-Scale Integration) necessary for driving the solid-state imaging element 1 and the actuator 8 of the CSP solid-state imaging element 20 are mounted. Here, it should be understood that a collection of various elements in FIG. 1 (and other figures) may be referred to as an imaging structure. For example, the imaging structure may include the CSP solid-state imaging element 20 (including solid-state imaging element 1), the lenses 61 and 62, a cavity layer 5 including an air cavity, the infrared cut filter 4, the glass substrate 2, the actuator 8, and one or more adhesive elements that hold these elements together (e.g., 13, 31, 32, 33). Said another way, the imaging structure may exclude the circuit substrate 7, the connector 9, external terminal 23, the signal processing unit 21, the spacer 10, and semiconductor elements 12.

Figure 2:
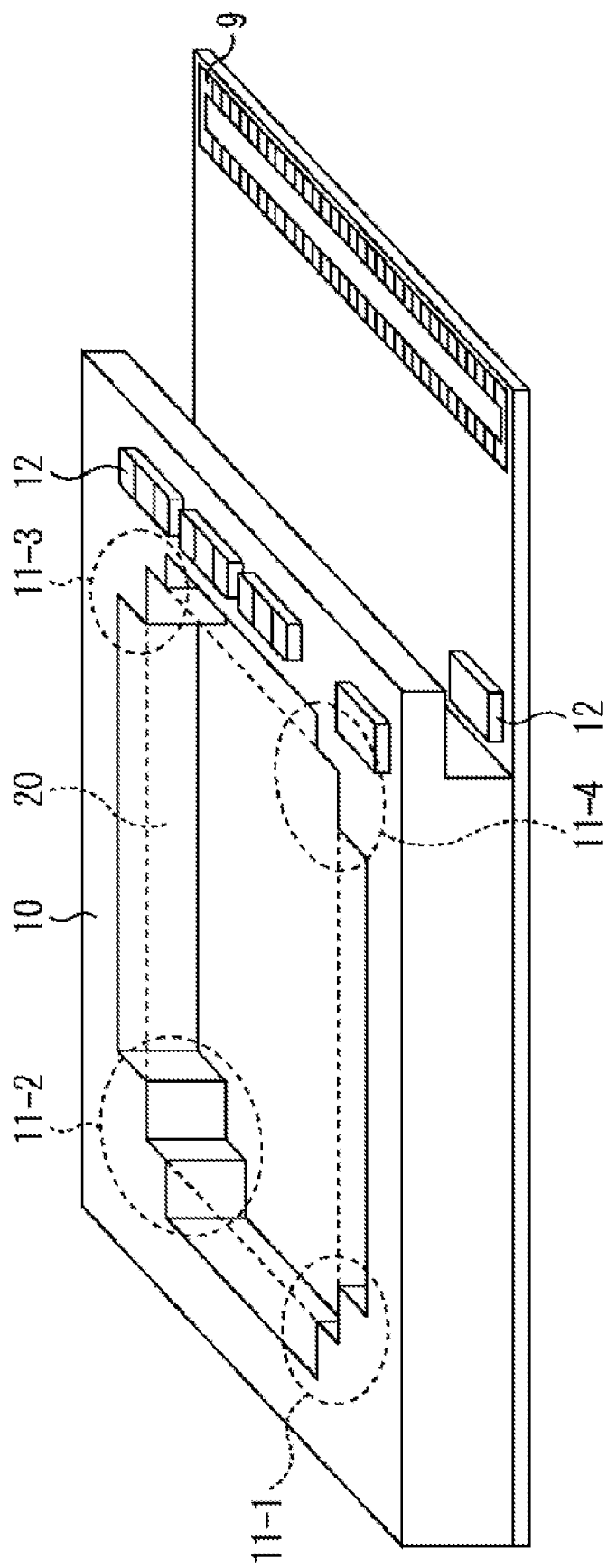
FIG. 2 is a diagram describing a configuration of a fixing portion provided in a spacer.

Further, as illustrated in FIG. 2, four corners of the CSP solid-state imaging element 20 are to be fitted into fixing portions 11-1 to 11-4 provided in the spacer 10. Only by fitting the four corners, the CSP solid-state imaging element 20 can be guided and fixed to a substantially appropriate position on the circuit substrate 7 only with the action of gravity even before injecting the fixing agent 13 into the circuit substrate 7. In other words, the fixing portions 11-1 to 11-4 are formed in the spacer 10 so that the four corners of the CSP solid-state imaging element 20 are guided to an appropriate position on the circuit substrate 7 when the CSP solid-state imaging element 20 is fitted into the opening of the spacer 10.

Note that the fixing portions 11-1 to 11-4 are formed to have a size that slight space is generated between the fixing portions 11-1 to 11-4 and the CSP solid-state imaging element 20 in the range in which the CSP solid-state imaging element 20 is allowed to intersect with the fixing portions 11-1 to 11-4 when the CSP solid-state imaging element 20 is placed at an appropriate position of the opening of the spacer 10. However, the fixing portions 11-1 to 11-4 have a structure for suppressing inclination and displacement of the CSP solid-state imaging element 20 due to warpage, distortion, or contraction thereof by coming into contact with the CSP solid-state imaging element 20 to guide the CSP solid-state imaging element 20 to an appropriate position when warpage, distortion, contraction, or the like of the CSP solid-state imaging element 20 is about to occur.

Therefore, by placing the CSP solid-state imaging element 20 on the spacer 10 so that the four corners are fitted into the fixing portions 11-1 to 11-4, the CSP solid-state imaging element 20 can be guided to and placed at an appropriate position on the circuit substrate 7 by the fixing portions 11-1 to 11-4, under the action of gravity by its own weight.

Further, after the CSP solid-state imaging element 20 is guided to and placed at an appropriate position on the circuit substrate 7, the position of the CSP solid-state imaging element 20 is not displaced even when injecting the fixing agent 13 into space between the CSP solid-state imaging element 20 and the spacer 10. Therefore, even when, for example, the fixing agent 13 is deformed before the fixing agent 13 is dried and fixed (cured), it is possible to suppress distortion, warpage, and inclination of the CSP solid-state imaging element 20 with respect to the circuit substrate 7.

Note that the spacer 10 may have a circuit configuration similar to that of the circuit substrate 7. Further, it is desirable that the material of the circuit substrate 7 is a material similar to (having a linear expansion coefficient similar to that of) silicon that is the material of the solid-state imaging element 1, or a material having a low elastic modulus lower than a predetermined elastic modulus.

Further, the actuator 8 may have at least one of an autofocus function and a camera shake correction function, or may be a fixed-focal lens holder.

Further, the autofocus function and the camera shake correction function may be realized by means other than the actuator.

Figure 3:
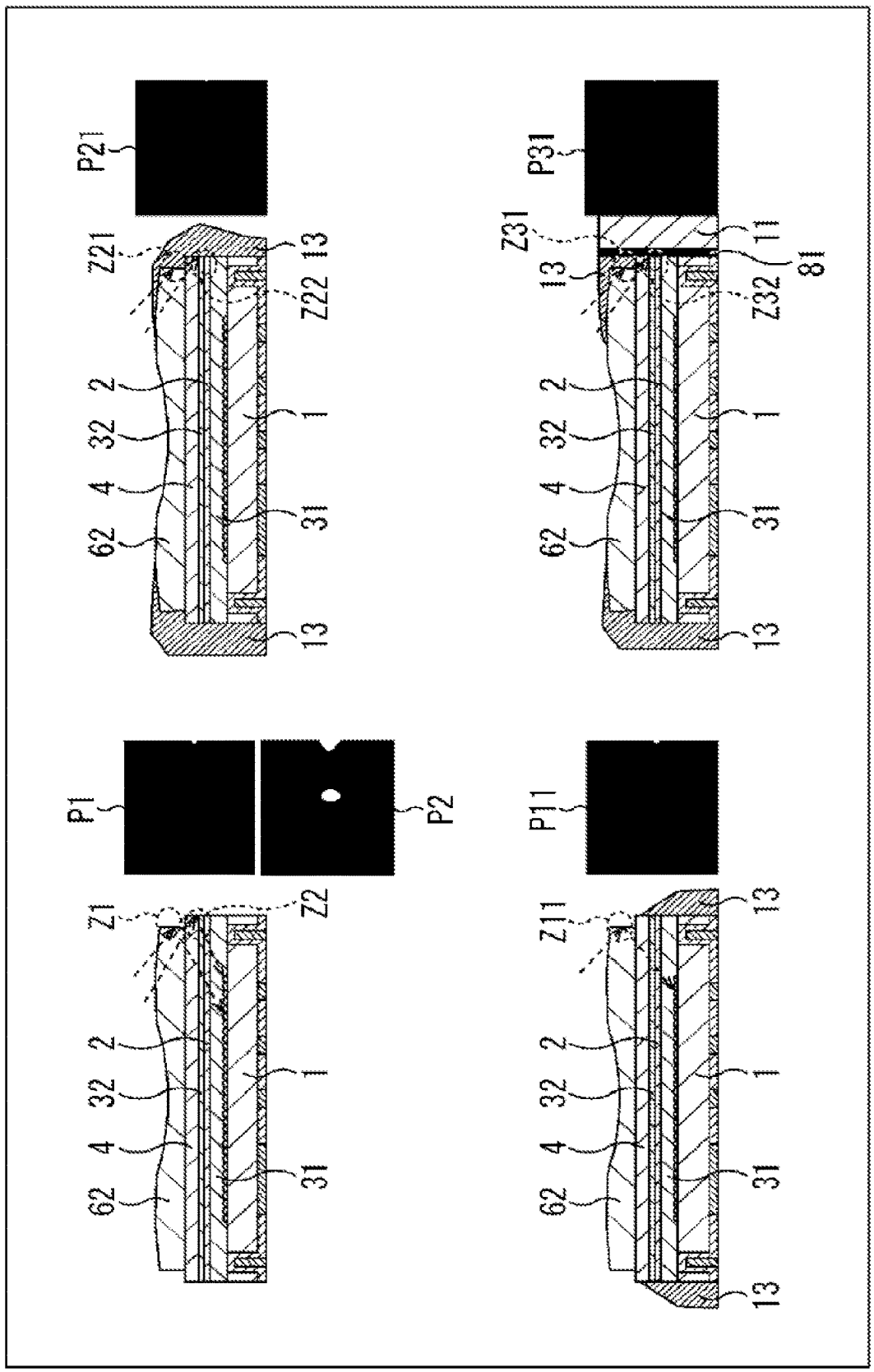
FIG. 3 is a diagram describing a principle of suppressing a flare phenomenon.

Further, it is known that in the case where the CSP solid-state imaging element 20 is fixed on the circuit substrate 7 and the above-mentioned fixing agent 13 is not used, a flare phenomenon due to diffused reflection of light as illustrated in the upper left part of FIG. 3 occurs. Specifically, in the upper left part of FIG. 3, for example, incident light illustrated by dotted lines is reflected on the end surface of the side surface portion of the lens 62, the end surface of the side surface portion of the infrared cut filter 4, or the like, as illustrated in ranges Z1 and Z2, and enters the CSP solid-state imaging element 20. Such reflection causes a flare phenomenon as illustrated by images P1 and P2 to occur. Note that the image P1 and P2 are examples of an image captured by the solid-state imaging element 1 of the CSP solid-state imaging element 20 having the configuration illustrated in the upper left part of FIG. 3.

In this regard, it is conceivable to suppress the reflection by, for example, embedding the fixing agent 13 including a light absorbing material such as black resin that absorbs light into the side (periphery the side surface) of the CSP solid-state imaging element 20 formed as an integral structure illustrated in the lower left part of FIG. 3. However, even in the case of using the fixing agent 13 formed of black resin or the like that absorbs light to be embedded into the side (periphery of the side surface) of the CSP solid-state imaging element 20 as illustrated in the lower left part of FIG. 3, for example, incident light illustrated by dotted lines as illustrated in a range Z11 is reflected on the end portion of the side surface portion of the lens 62 to enter the CSP solid-state imaging element 20 in some cases unless the fixing agent 13 completely covers the entire side (periphery of the side surface).

As a result, diffused reflection of light occurs, which causes a flare phenomenon as illustrated by an image P11 to occur. Further, it is also known that, as illustrated in a range Z41 in the left part of FIG. 4, incident light illustrated by dotted lines is reflected on the spacer 10, diffused reflection of light occurs, and a flare phenomenon occurs as illustrated by an image P41.

The imaging apparatus illustrated in FIG. 1 uses the fixing agent 13 including a light absorbing material such as black resin that absorbs light to cover the entire periphery of the side surface including the peripheral portion of the incident surface of incident light of the lens 62, the infrared cut filter 4, the solid-state imaging element 1, the glass substrate 2, and the adhesives 31 and 32 as illustrated in the upper right part of FIG. 3, for example, in order to suppress the above-mentioned flare phenomenon. Therefore, as illustrated by ranges Z21 and Z22 in the upper right part of FIG. 3, even in the case where incident light illustrated by dotted lines is incident, the incident light is not reflected because it is absorbed. As a result, for example, as illustrated by an image P21, the influence due to the flare phenomenon is reduced.

Figure 4:
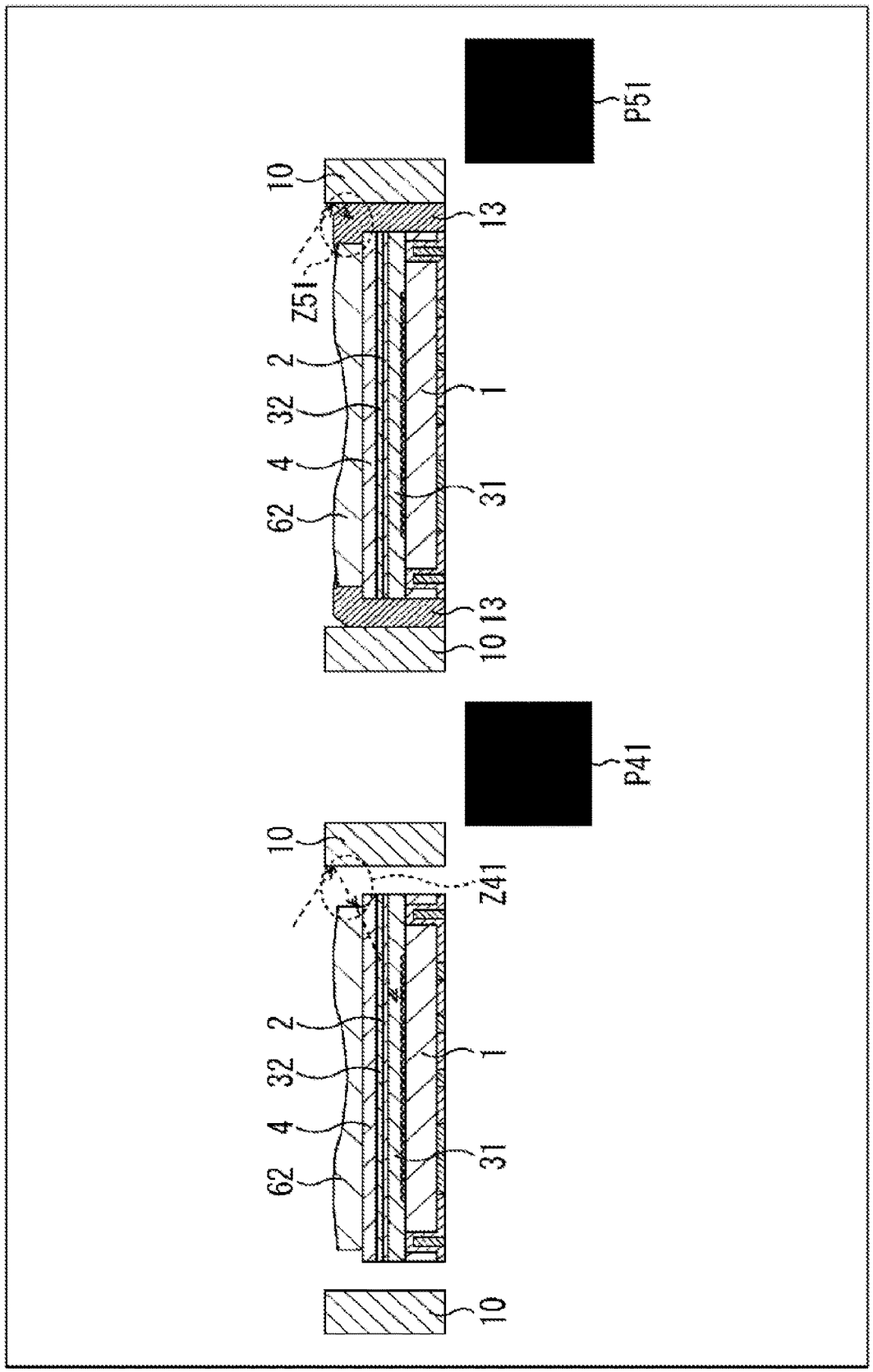
FIG. 4 is a diagram describing a principle of suppressing a flare phenomenon.

Further, as illustrated in the right part of FIG. 4, by using the fixing agent 13 having black color or the like, which absorbs light, to fill the space up to the spacer 10 while covering the entire periphery of the side surface of the CSP solid-state imaging element 20, even in the case where incident light illustrated by dotted lines is reflected on the spacer 10 as illustrated in a range Z51, the reflected light is absorbed, so that the reflection is suppressed. As a result, it is possible to prevent (or alternatively, suppress) a flare phenomenon due to diffused reflection of light from the spacer 10 from occurring. Note that it is desirable to use, as the fixing agent 13 formed of a light absorbing material such as black resin that absorbs light, one having a reflectance of not more than 5%, for example.

Note that in the imaging apparatus illustrated in FIG. 1, the fixing portions 11 for correcting the inclination of the glass substrate 2 and the solid-state imaging element 1 are provided to the spacer 10 in order to prevent the CSP solid-state imaging element 20 from being inclined. In the case where it is difficult to fill the fixing agent 13 formed of a light absorbing material such as black resin that absorbs light between the CSP solid-state imaging element 20 and the fixing portions 11 for correcting the inclination, it is possible to achieve the same effect by performing, in advance, processing (mask processing) of applying a mask (that is the same as a mask 81 to be described with reference to FIG. 5) formed of a black light absorbing material to the walls (surfaces) of the fixing portions 11 for correcting the inclination.

Specifically, as illustrated in the lower right part of FIG. 3, a mask processing of applying a mask formed of a black light absorbing material to the surfaces of the fixing portions 11 of the spacer 10 for correcting the inclination of the glass substrate and the solid-state imaging element may be performed. With this, as illustrated in a range Z31 in the lower right part of FIG. 3, even in the case where incident light illustrated by dotted lines is incident, the incident light is not reflected because it is absorbed. As a result, for example, as illustrated by an image P31, the influence due to the flare phenomenon is reduced.

As illustrated in the upper right part and the lower right part of FIG. 3 described above, an example in which the fixing agent 13 formed of a light absorbing material such as black resin that absorbs light is provided so as to cover the entire periphery of the side surface of the CSP solid-state imaging element 20 or a mask formed of a black light absorbing material that absorbs light is applied to the walls (surfaces) of the fixing portions 11 has been described. However, in the imaging apparatus illustrated in FIG. 1, the light absorbing material of any one of the fixing agent 13 and the mask is provided to shield not only the entire periphery of the side surface of the CSP solid-state imaging element 20 but also a part of the incident surface of the lens 62 in the lowermost layer on which incident light is to be incident.

Figure 5:
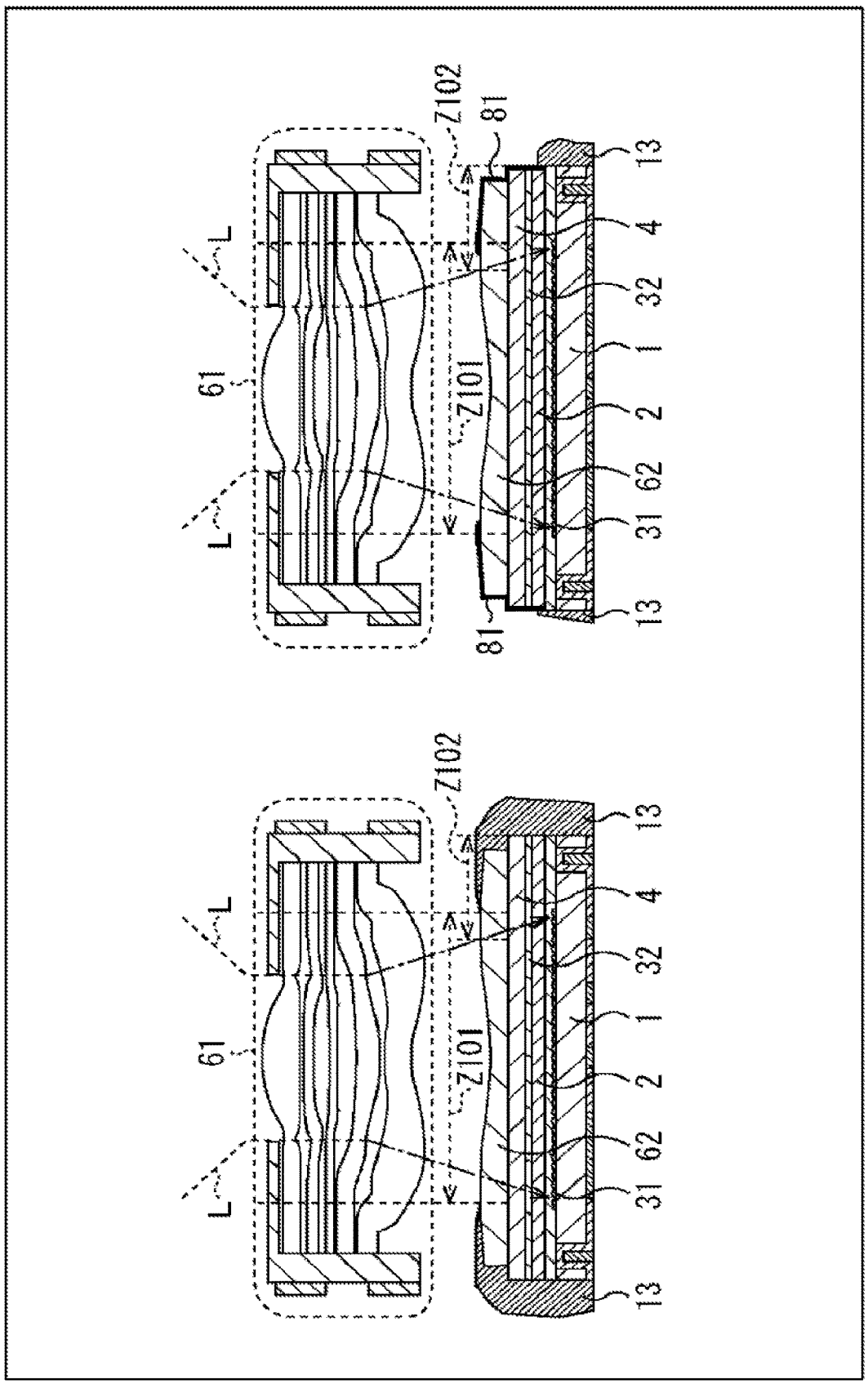
FIG. 5 is a diagram describing an example in which a fixing agent or a mask is formed in an outer peripheral portion of a lens.

Specifically, as illustrated in the upper left part of FIG. 5, in the case of embedding the fixing agent 13 formed of a light absorbing material such as black resin into the periphery of the CSP solid-state imaging element 20, the fixing agent 13 is embedded (applied) so as to cover a black mask area Z102 that is an area other than the area in which incident light enters the CSP solid-state imaging element 20 within an effective pixel area Z101 as illustrated in a light path L of light condensed by the lens 62.

That is, a light beam from the lens 62 that enters the effective pixel area Z101 generally enters pixels in the effective pixel area Z101 of the CSP solid-state imaging element 20 at an acute angle from the outside, which may cause a flare phenomenon to occur. In this regard, as illustrated in the left part of FIG. 5, the fixing agent 13 formed of a light absorbing material such as black resin is embedded into (applied to) the area up to the outer peripheral portion of the lens 62 in the lowermost layer in a mask area Z102 that is the outer peripheral portion of the lens 62 in the lowermost layer.

Note that the size of the mask area Z102 surrounding the outer peripheral portion of the lens 62 in the lowermost layer is calculated on the basis of design values of the lens 61 in the upper layer and the microlens of the pixel of the CSP solid-state imaging element 20.

Further, the mask area Z102 including the periphery of the side surface the CSP solid-state imaging element 20 and the outer peripheral portion of the lens 62 may include the mask 81 formed of, for example, not the fixing agent 13 but a black light absorbing material as illustrated in the right part of FIG. 5. Also with such a configuration, it is possible to prevent (or alternatively, suppress) a flare phenomenon from occurring.

Figure 6:
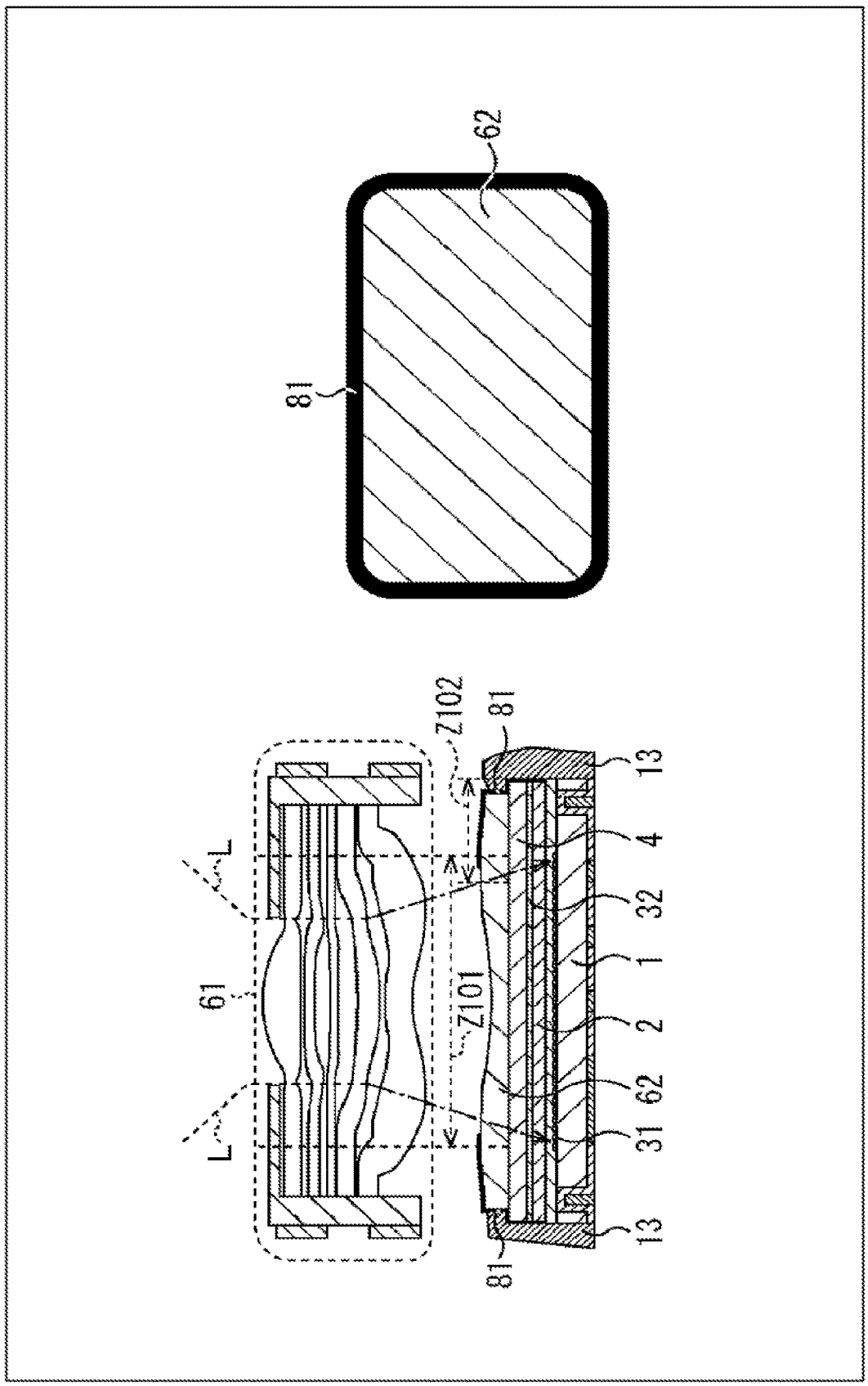
FIG. 6 is a diagram describing an example in which the fixing agent is formed around the side surface of a CSP solid-state imaging element and the mask is formed in the outer peripheral portion of the lens.

Further, as illustrated in the left part of FIG. 6, the fixing agent 13 may be embedded into the periphery of the side surface of the CSP solid-state imaging element 20, and the mask 81 may be formed in the mask area Z102 on the lens 62.

Meanwhile, in the case of applying the fixing agent 13 formed of a light absorbing material such as black resin to the area up to the mask area Z102 of the lens 62 in the lowermost layer with high accuracy by a coating apparatus at the time of production of a solid-state imaging apparatus, there is a possibility that the coating apparatus becomes expensive or a high degree of control is necessary, which increases the cost in any case.

In this regard, as illustrated in the right part of FIG. 6, by performing mask processing on only the mask area Z102 of the lens 62 in the lower most layer to form the mask 81 in advance, it is possible to reduce the necessary accuracy of application of the fixing agent 13 formed of a light absorbing material such as black resin at the time of production of a solid-state imaging apparatus. As a result, it is possible to reduce the necessary accuracy and the degree of difficulty of control regarding the coating apparatus, which reduces the cost.

Note that the mask 81 may be applied directly to the lens 62 itself in the lowermost layer before the lens 62 is formed in the CSP solid-state imaging element 20. Alternatively, the mask 81 may be applied to the lens 62 in the lowermost layer after the lens 62 is formed in the CSP solid-state imaging element 20.

<Manufacturing Method for Imaging Apparatus>

Figure 7:
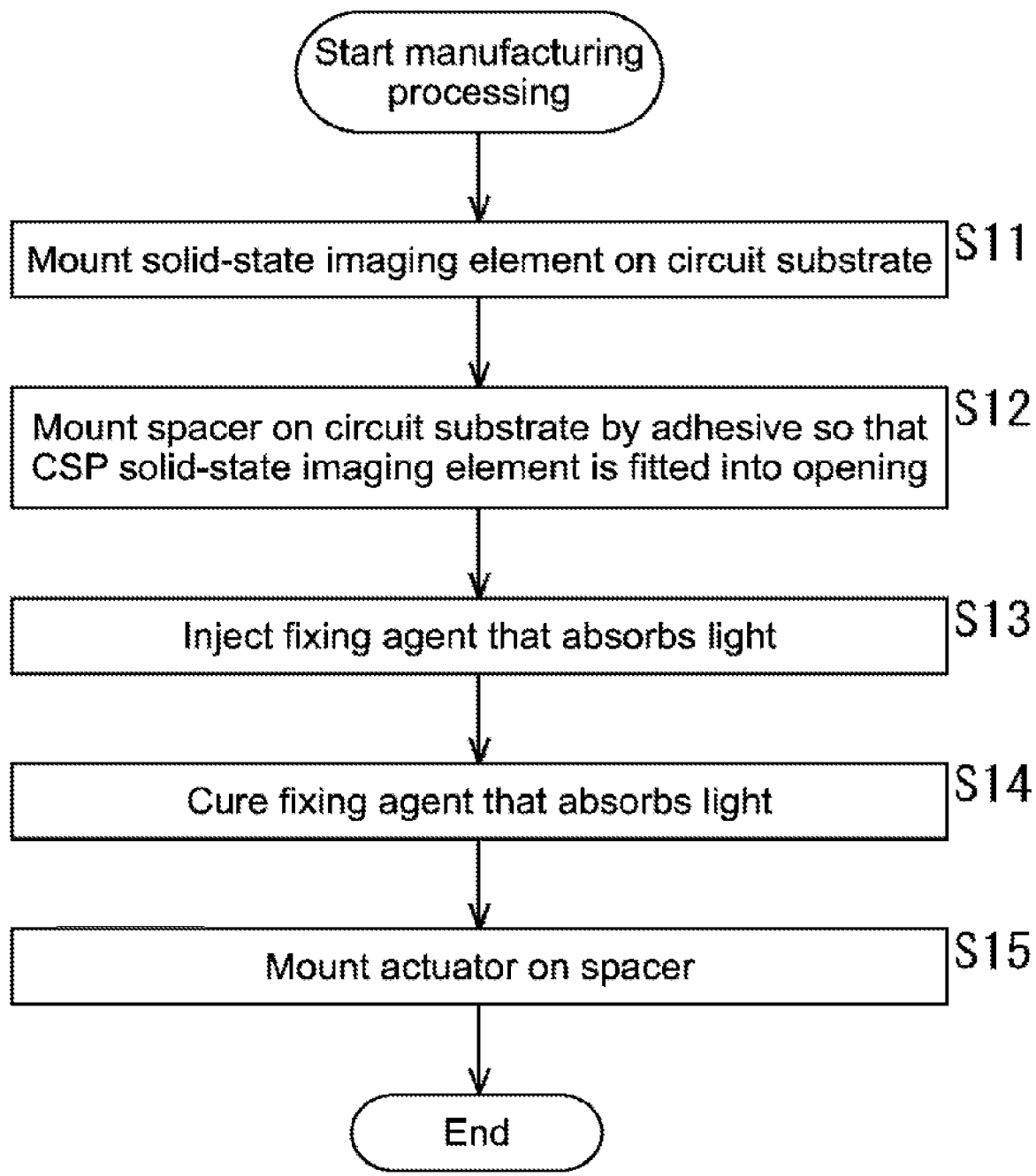
FIG. 7 is a flowchart describing a manufacturing method for the imaging apparatus illustrated in FIG. 1.

Next, a manufacturing method for the imaging apparatus illustrated in FIG. 1 will be described with reference to the flowchart of FIG. 7.

In Step 11, the CSP solid-state imaging element 20 is mounted on the circuit substrate 7.

In Step S12, the spacer 10 is mounted on the circuit substrate 7 by an adhesive in the state where the four corners of the CSP solid-state imaging element 20 are fitted into the fixing portions 11-1 to 11-4 of the spacer 10 so as to be guided to appropriate positions on the circuit substrate 7. As a result, the CSP solid-state imaging element 20 is guided by the fixing portions 11-1 to 11-4 and placed at an appropriate position on the circuit substrate 7 where electrical connection is possible, under the action of gravity by its own weight, even on the thin circuit substrate 7 in which deflection and the like are likely to occur.

In Step S13, the fixing agent 13 formed of a light absorbing material such as black resin that absorbs light for suppressing reflection of light from the side (periphery of the side surface) is injected into space between the CSP solid-state imaging element 20 and the spacer 10 in order to suppress a flare phenomenon due to diffused reflection of light. In Step S14, the fixing agent 13 is cured (fixed). Note that the fixing agent 13 is applied to the area from the bottom portion of the CSP solid-state imaging element 20 to the outer peripheral portion of the lens 62 to suppress reflection of light from the side (periphery of the side surface). As a result, the CSP solid-state imaging element 20, the spacer 10, and the circuit substrate 7 are fixed via the fixing agent 13. Since the state where the CSP solid-state imaging element 20 is placed at an appropriate position by the fixing portions 11-1 to 11-4 is kept until the fixing agent 13 is fixed after the fixing agent 13 is injected, the CSP solid-state imaging element 20 is appropriately fixed without causing distortion, warpage, and inclination to occur.

In Step S15, the actuator 8 is mounted on the spacer 10.

In the case of using the mask 81, it is necessary to perform a process of applying the mask 81 to the walls (surfaces) of the fixing portions 11 in advance.

Further, in the case of applying the mask 81 to the outer peripheral portion of the lens 62 in the lowermost layer, it is necessary to perform a process of applying the mask 81 to the outer peripheral portion of the lens 62 in the lowermost layer.

By the series of manufacturing methods described above, it is possible to fix the CSP solid-state imaging element 20 by the fixing agent 13 in the state where the CSP solid-state imaging element 20 is placed at an appropriate position on the thin circuit substrate 7 in which deflection is likely to occur.

As a result, it is possible to suppress deterioration of the yield and optical performance of the imaging apparatus, and realize a high-performance, small-sized, and thin imaging apparatus capable of suppressing a flare phenomenon due to diffused reflection of light.

2. Second Embodiment

In order to meet the market demands for miniaturization of cameras in recent years, the two groups of lenses including the lenses 61 and 62 in the imaging apparatus illustrated in FIG. 1 may be integrated into one group of lenses including lenses 6, and the imaging apparatus according to the present disclosure may adopt a configuration similar to such a configuration.

Figure 8:
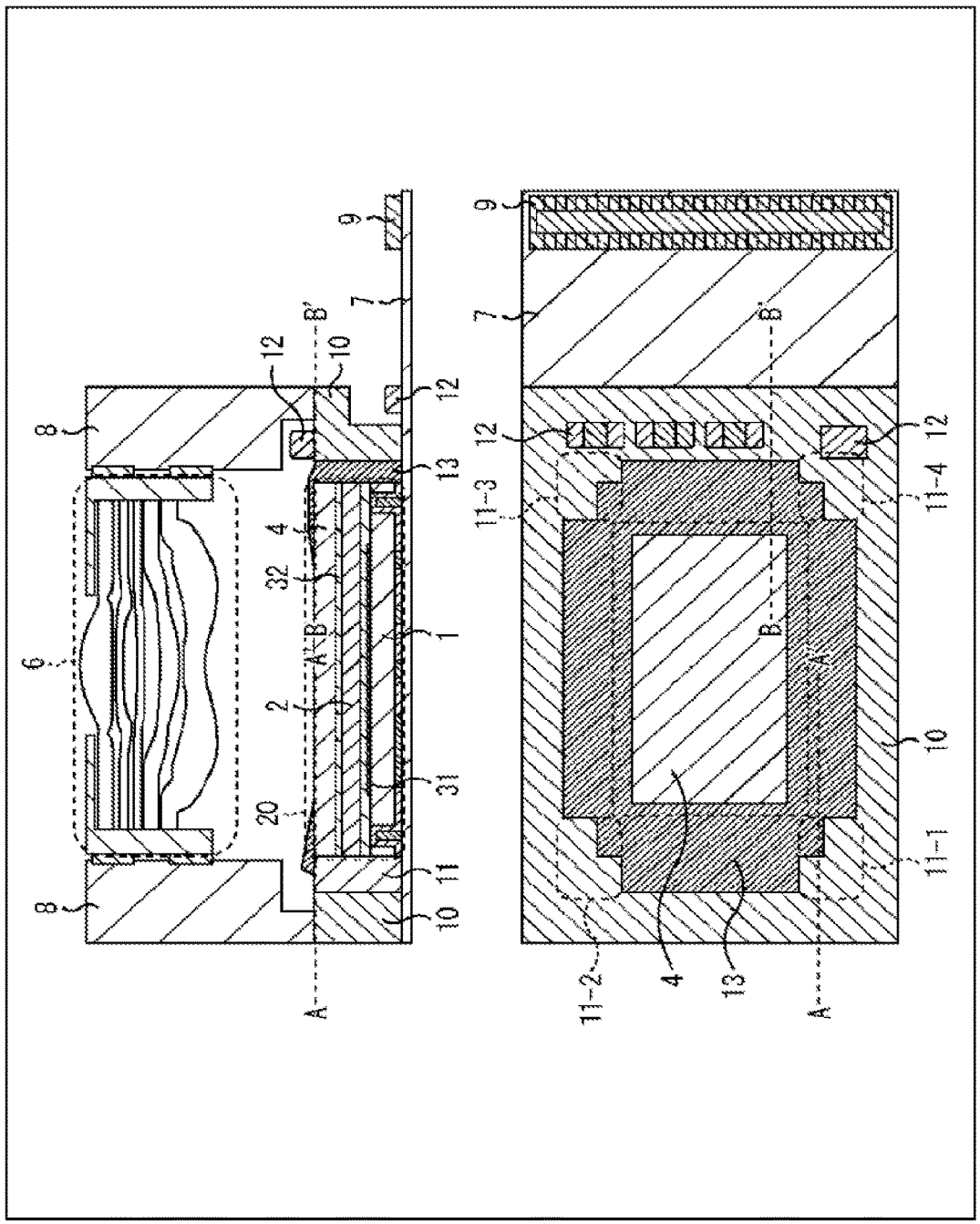
FIG. 8 is a diagram describing a configuration example of an imaging apparatus according to a second embodiment of the present disclosure.

Further, for example, as illustrated by the imaging apparatus in FIG. 8, the lens 62 in the lowermost layer may be placed above the infrared cut filter 4 as a configuration of the lens. With such a configuration, it is possible to realize a small-sized and thin imaging apparatus in which optical distortion and inclination are suppressed, similarly to the imaging apparatus illustrated in FIG. 1.

Note that the CSP solid-state imaging element 20 in the imaging apparatus illustrated in FIG. 8 has a configuration obtained by adding the lens 62 in the lowermost layer to the uppermost layer of the CSP solid-state imaging element 20 illustrated in FIG. 1 so that the lenses are integrated.

Note that in the case where the lenses 6 include a plurality of lenses, the lenses 6 may be divided into two or more groups of lenses. Further, in each group, the number of lenses constituting the group can be changed as necessary as long as the group includes at least one lens.

Also with the configuration described above, it is possible to suppress deterioration of the yield and optical performance of the imaging apparatus, and realize a high-performance, small-sized, and thin imaging apparatus capable of suppressing a flare phenomenon due to diffused reflection of light.

3. Third Embodiment

In recent years, it is known that the shape of the circuit substrate 7 of the imaging apparatus is changed for each product due to diversification of camera products on the market. In this regard, as illustrated in FIG. 9, an ACF (Anisotropic Conductive Film) mechanism 91 may be provided on the circuit substrate 7 instead of a connector 9 to realize a small-sized and thin imaging apparatus in which optical warpage, distortion, and inclination are suppressed according to the diversification of camera products without changing the production method for the imaging apparatus.

4. Fourth Embodiment

Figure 9:
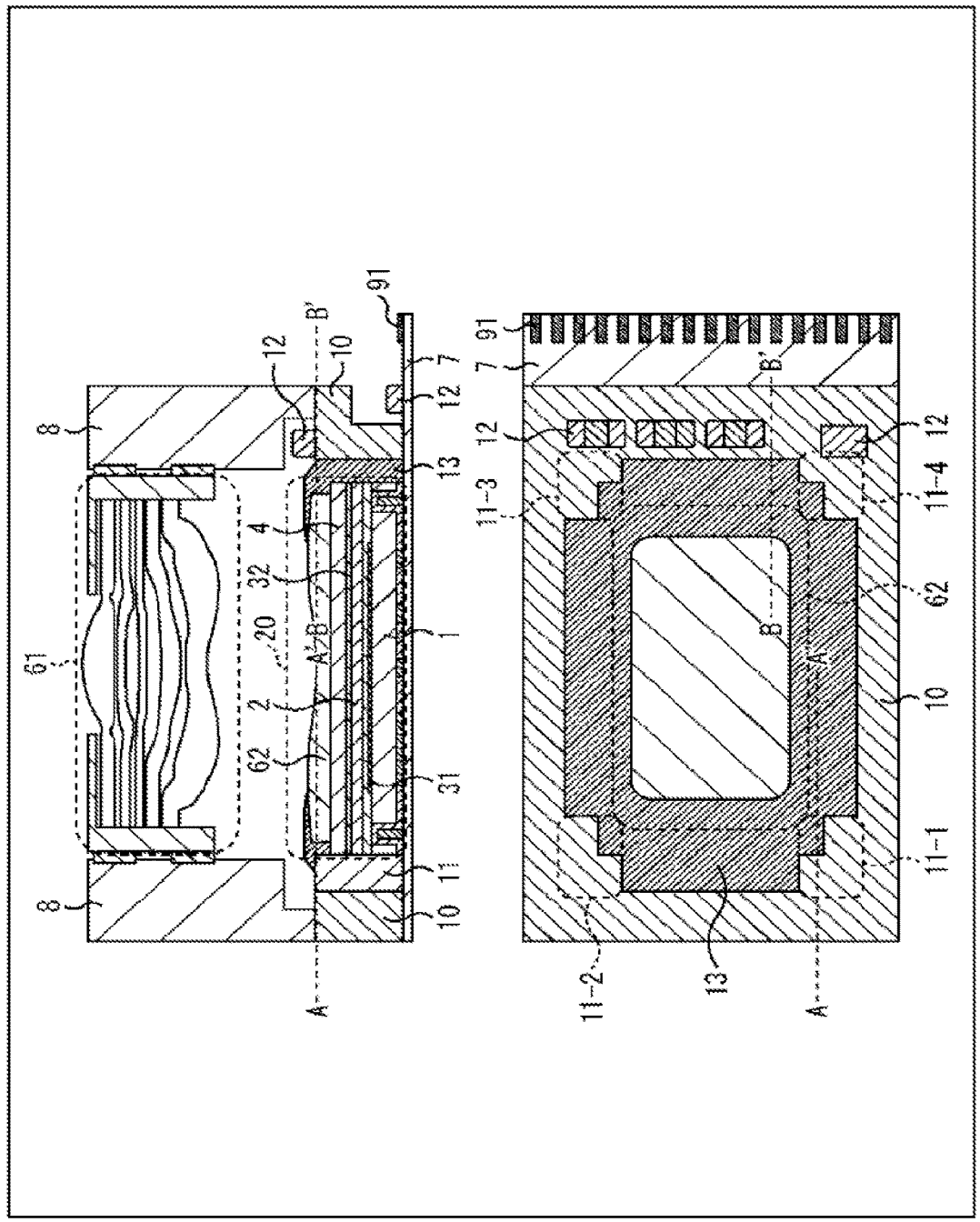
FIG. 9 is a diagram describing a configuration example of an imaging apparatus according to a third embodiment of the present disclosure.

As the infrared cut filter 4 used in the imaging apparatus illustrated in FIG. 1, FIG. 8, and FIG. 9, one having small warpage and distortion is used. However, it is known that the infrared cut filter 4 having small warpage and distortion is expensive.

Further, it is also known that since in the case where the infrared cut filter 4 is mounted on the CSP solid-state imaging element 20, the warpage or distortion of the infrared cut filter 4 affects the distortion, warpage, and inclination of the solid-state imaging element 1, there is a need to mount the expensive infrared cut filter 4.

In this regard, the infrared cut filter 4 may be mounted on the imaging apparatus as an external configuration of the CSP solid-state imaging element 20.

Figure 10:
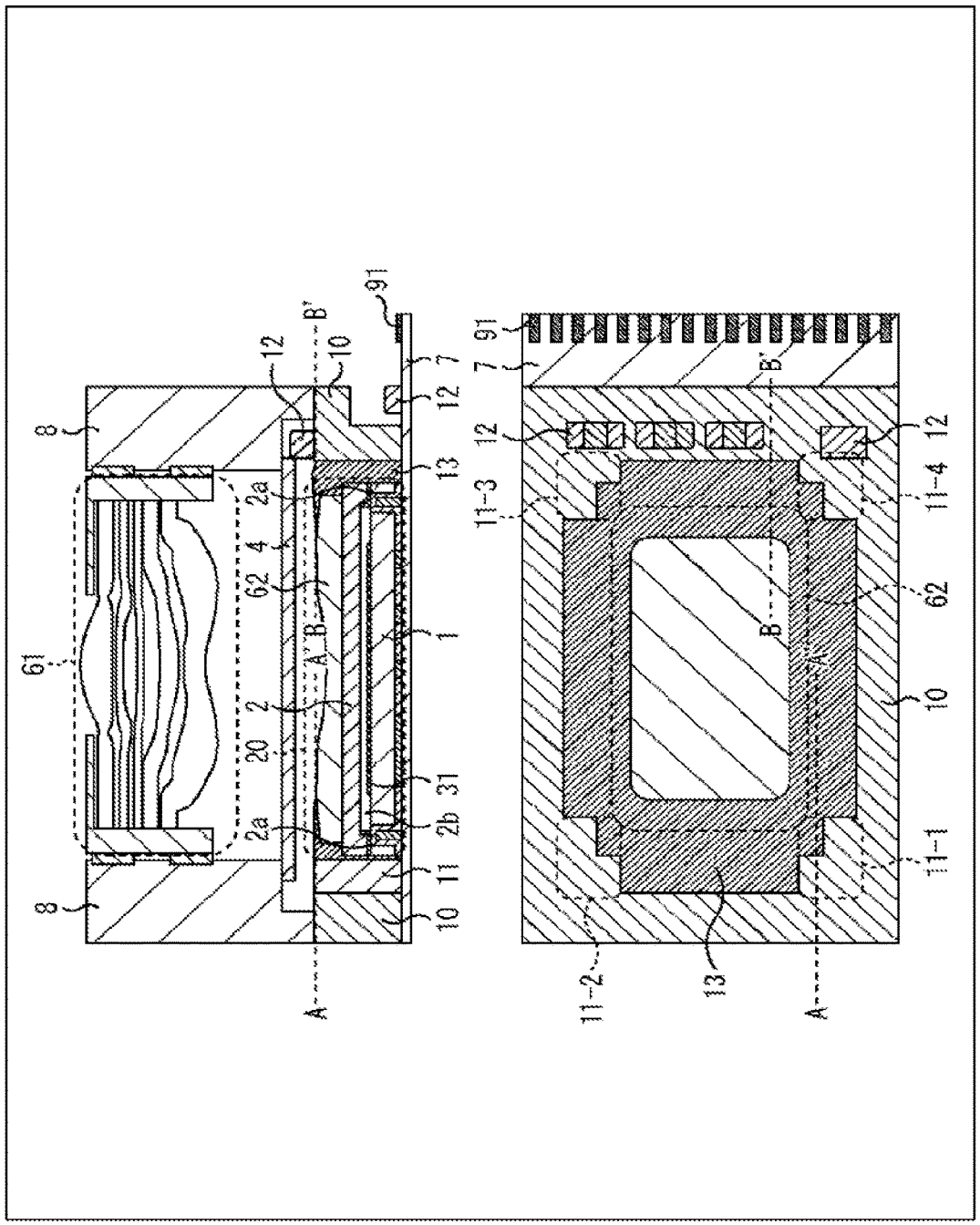
FIG. 10 is a diagram describing a configuration example of an imaging apparatus according to a fourth embodiment of the present disclosure.

FIG. 10 illustrates a configuration example of an imaging apparatus in which the infrared cut filter 4 is mounted on the lowermost portion of the actuator 8 as an external configuration of the CSP solid-state imaging element 20.

In the imaging apparatus illustrated in FIG. 10, the infrared cut filter 4 is mounted on the lowermost portion of the actuator 8 outside the CSP solid-state imaging element 20. With such a configuration, even when using the inexpensive infrared cut filter 4, it is possible to suppress optical distortion and inclination because the infrared cut filter 4 is mounted as an external configuration of the CSP solid-state imaging element 20.

As a result, it is possible to suppress deterioration of the yield and optical performance of the imaging apparatus, and realize a high-performance, small-sized, and thin imaging apparatus capable of suppressing a flare phenomenon due to diffused reflection of light.

Note that the CSP solid-state imaging element 20 in the imaging apparatus illustrated in FIG. 10 has a configuration obtained by excluding the infrared cut filter 4 from the configuration of the CSP solid-state imaging element 20 illustrated in FIG. 1.

Further, the CSP solid-state imaging element 20 in the imaging apparatus illustrated in FIG. 10 has a configuration in which a frame 2a is provided around the glass substrate 2 and a cavity 2b is provided between the solid-state imaging element 1 and the glass substrate 2, i.e., a cavity structure. Further, in the imaging apparatus according to an embodiment of the present disclosure, the CSP solid-state imaging element 20 may have a so-called cavityless structure in which the cavity 2b illustrated in FIG. 1, FIG. 8, and FIG. 9 is not provided, or may have a cavity structure.

5. Fifth Embodiment

The example in which the inexpensive infrared cut filter 4 can be used for reducing the cost by mounting the infrared cut filter 4 on the lowermost portion of the actuator 8 so that the infrared cut filter 4 is not integrated into the CSP solid-state imaging element 20 has been described above. However, instead of the infrared cut filter 4, a material similar to the glass substrate 2, which can reduce infrared light, may be used.

Specifically, the glass substrate 2 serving as a key component of the imaging apparatus illustrated in FIG. 1, FIG. 8, and FIG. 9 can be substituted for the infrared cut filter 4 having small warpage and distortion.

Figure 11:
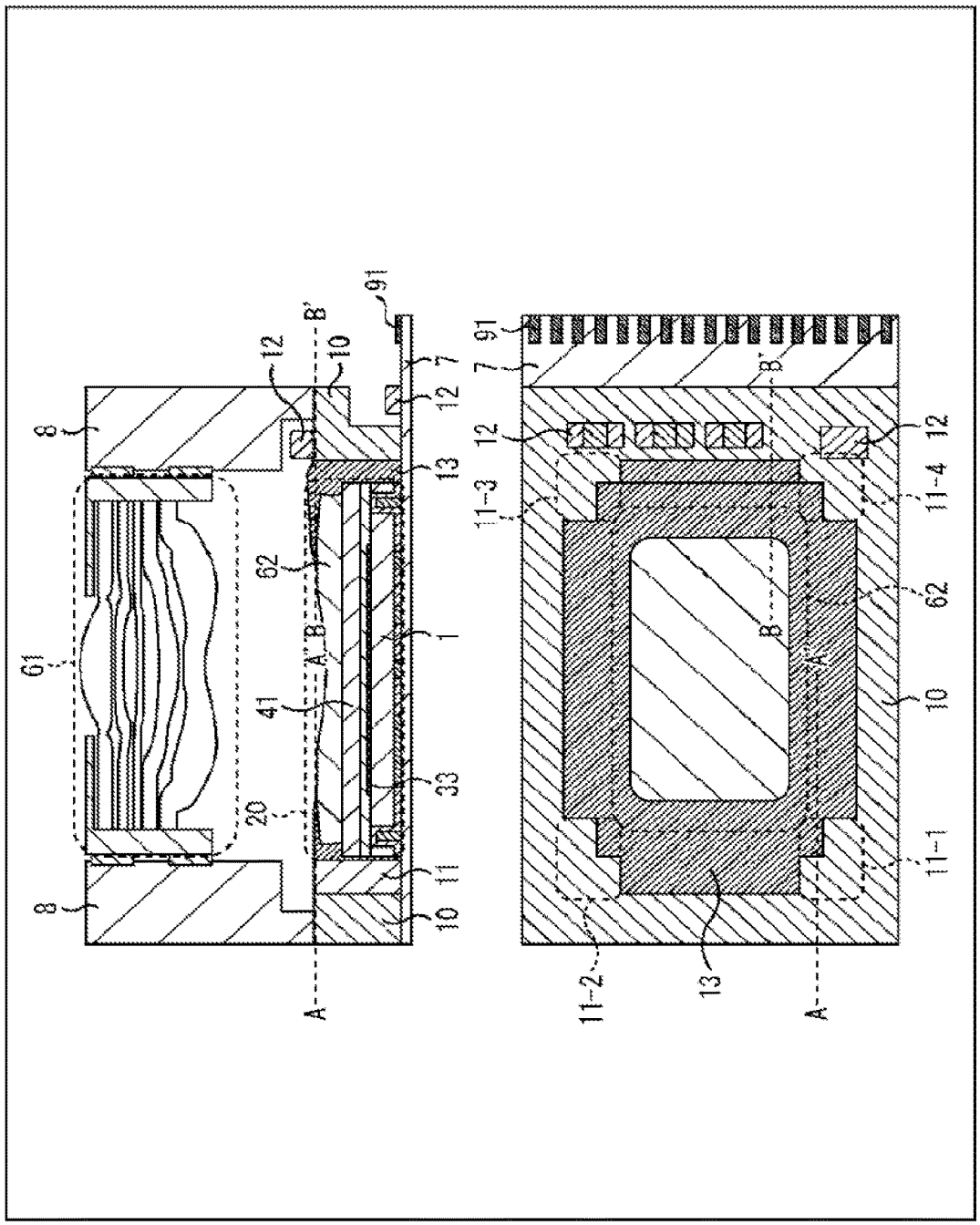
FIG. 11 is a diagram describing a configuration example of an imaging apparatus according to a fifth embodiment of the present disclosure.

FIG. 11 illustrates a configuration example of the imaging apparatus using, instead of the infrared cut filter 4 having small warpage and distortion, a glass substrate 41 that is formed of a material similar to the glass substrate 2 serving as a key component of the imaging apparatus illustrated in FIG. 1, FIG. 8, and FIG. 9, and capable of reducing infrared light.

With such a configuration, since it is possible to suppress warpage and distortion without using the expensive infrared cut filter 4 having small warpage and distortion, it is possible to realize a small-sized and thin imaging apparatus having small optical warpage, distortion, and inclination at low cost, and suppress a flare phenomenon due to diffused reflection of light.

Note that the CSP solid-state imaging element 20 in the imaging apparatus illustrated in FIG. 11 has a configuration obtained by excluding the infrared cut filter 4 from the CSP solid-state imaging element 20 illustrated in FIG. 9 and instead of the glass substrate 2 and providing the glass substrate 41 capable of cutting infrared light, and is adhered to the solid-state imaging element 1 by a transparent adhesive 33. The glass substrate 41 capable of cutting infrared light is, for example, a soda-lime glass that absorbs near infrared light.

6. Sixth Embodiment

The example in which the glass substrate 41 is used instead of the infrared cut filter 4 has been described above.

However, by sandwiching the infrared cut filter 4 between the glass substrate 2 and the solid-state imaging element 1, the inexpensive infrared cut filter 4 may be used.

Figure 12:
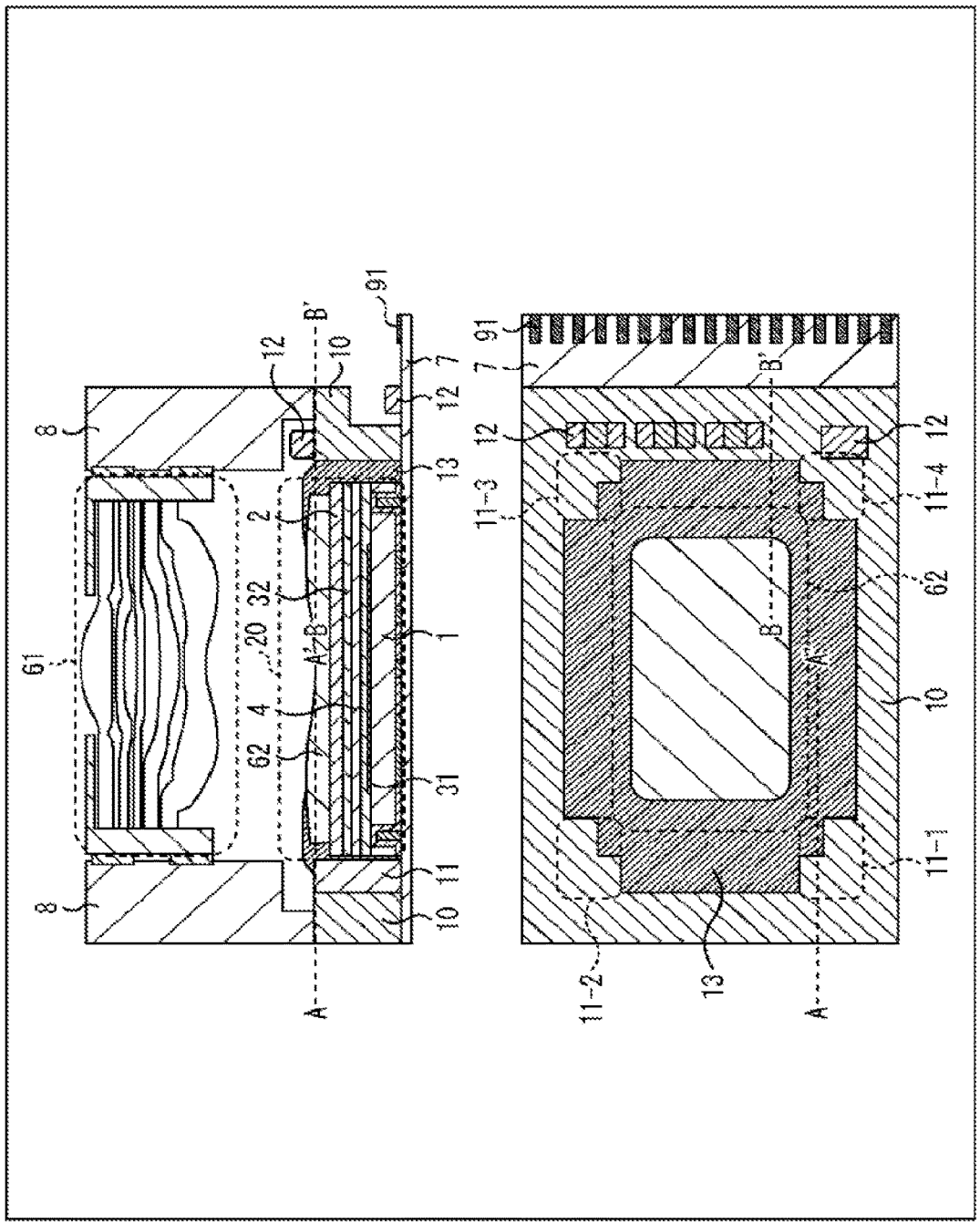
FIG. 12 is a diagram describing a configuration example of an imaging apparatus according to a sixth embodiment of the present disclosure.

On the imaging apparatus illustrated in FIG. 12, the CSP solid-state imaging element 20 in which warpage and distortion of the infrared cut filter 4 are suppressed by sandwiching the infrared cut filter 4 between the glass substrate 2 and the solid-state imaging element 1 having small warpage and distortion in order to suppress warpage and distortion of the infrared cut filter 4 is mounted.

With such a configuration, even when using the inexpensive infrared cut filter 4 having relatively large warpage and distortion, by sandwiching the infrared cut filter 4 between the glass substrate 2 and the solid-state imaging element 1 having small warpage and distortion, warpage and distortion of the inexpensive infrared cut filter 4 can be physically suppressed. Therefore, it is possible to realize a small-sized and thin imaging apparatus having small optical warpage, distortion, and inclination at low cost, and suppress a flare phenomenon due to diffused reflection of light.

Note that the CSP solid-state imaging element 20 in the imaging apparatus illustrated in FIG. 12 has a configuration obtained by replacing the arrangement of the infrared cut filter 4 and the glass substrate 2 in the configuration of the CSP solid-state imaging element 20 illustrated in FIG. 9 with each other.

7. Seventh Embodiment

The configuration example in which the fixing portions 11-1 to 11-4 are provided at positions on the spacer 10 so as to guide the four corners of the CSP solid-state imaging element 20 to appropriate positions has been described above. However, the fixing portions 11-1 to 11-4 may be provided at other positions.

Figure 13:
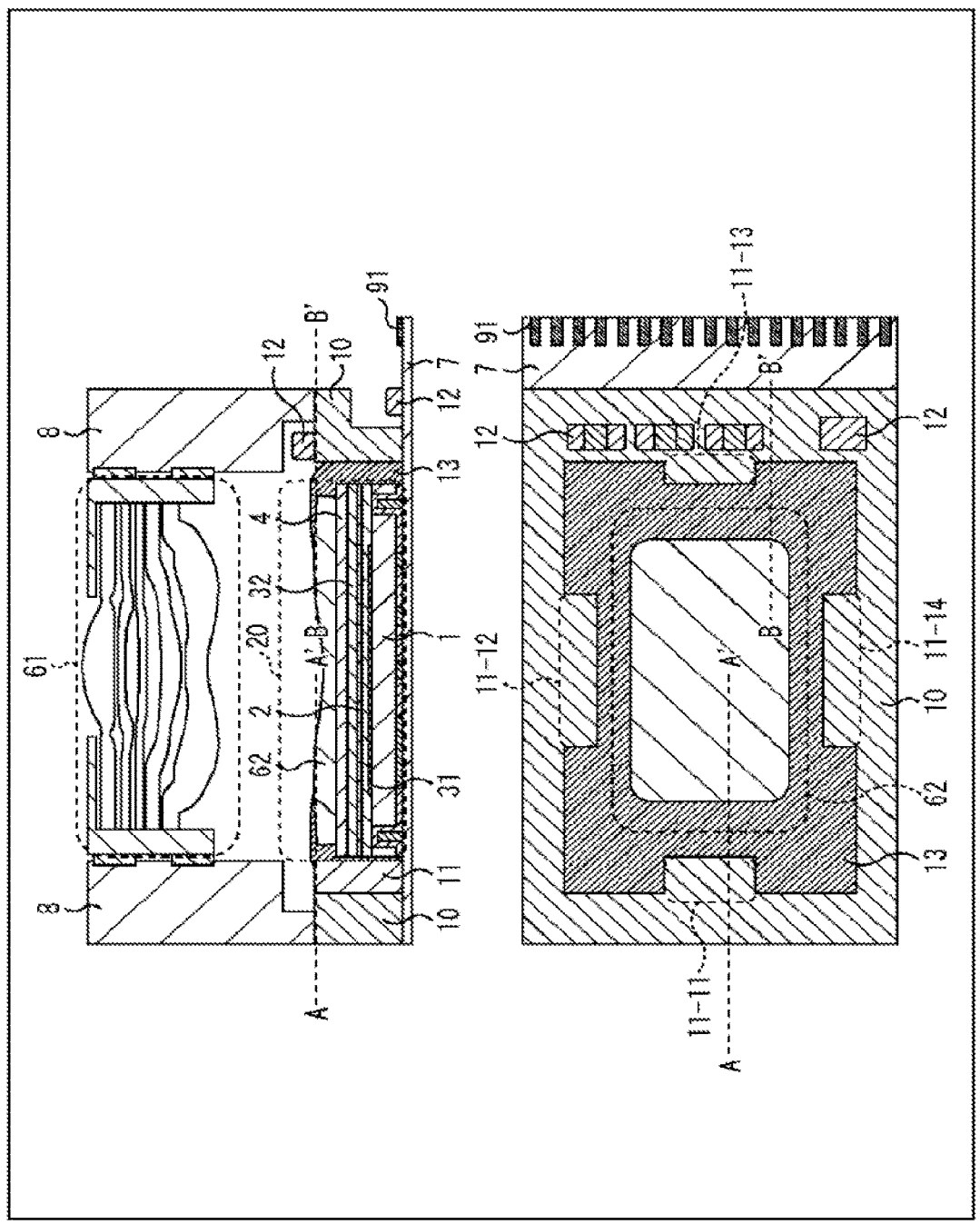
FIG. 13 is a diagram describing a configuration example of an imaging apparatus according to a seventh embodiment of the present disclosure.

FIG. 13 illustrates a configuration example of the imaging apparatus in which fixing portions 11-11 to 11-14 are provided instead of the fixing portions 11-1 to 11-4.

Specifically, the fixing portions 11-11 to 11-14 are provided on the spacer 10 so as to guide the periphery of the central portions of the four sides of the CSP solid-state imaging element 20 to appropriate positions. Along with this, the fixing agent 13 is injected into the periphery of the four corners of the CSP solid-state imaging element 20, and fixed to the spacer 10.

As described above, by providing the fixing portions 11 so as to guide the four sides of the CSP solid-state imaging element 20 to appropriate positions, it is possible to place the CSP solid-state imaging element 20 at an appropriate position on the circuit substrate 7 with high accuracy.

The arrangement of the fixing portions 11 is not limited to the above. For example, as illustrated in the uppermost part of FIG. 14, fixing portions 11-21 to 11-24 may be provided at positions on the spacer 10 corresponding to end portions of the four sides of the CSP solid-state imaging element 20. In this case, the fixing agent 13 is injected into fixing agents 13-21 to 13-24.

Figure 14:
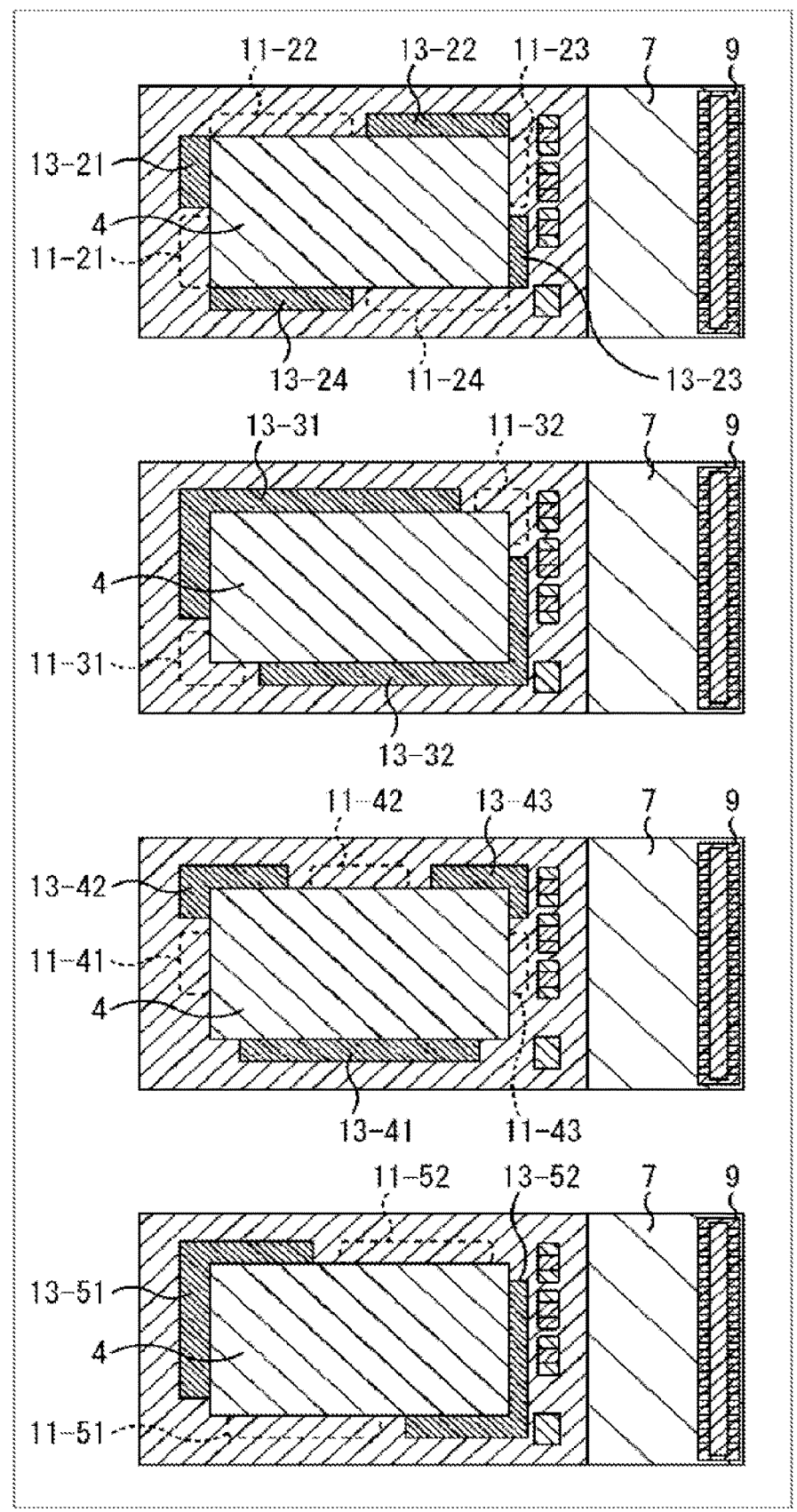
FIG. 14 is a diagram describing an arrangement example of the fixing portion.

Similarly, as illustrated in the second part from the top of FIG. 14, fixing portions 11-31 and 11-32 may be provided at positions on the spacer 10 corresponding to corner portions on any diagonal line of the CSP solid-state imaging element 20. In this case, the fixing agent 13 is injected into fixing agents 13-31 and 13-32. Also in the example of the second part from the top of FIG. 14, the four sides of the CSP solid-state imaging element 20 are fixed by the fixing portions 11-31 and 11-32.

Even in the case where the fixing portions 11 for guiding all of the four sides of the CSP solid-state imaging element 20 to appropriate positions are not used, by guiding a part of the CSP solid-state imaging element 20 to an appropriate position, it is possible to place the CSP solid-state imaging element 20 at an appropriate position with high accuracy as compared with the case where the fixing portions 11 are not provided.

For example, as illustrated in the second part from the bottom of FIG. 14, fixing portions 11-41 to 11-43 may be provided at positions on the spacer 10 so as to guide three sides of the CSP solid-state imaging element 20 to appropriate positions. In this case, the fixing agent 13 is injected into fixing agents 13-41 to 13-43, for example. In this case, only the three sides of the CSP solid-state imaging element 20 are fixed. However, it is possible to place the CSP solid-state imaging element 20 at an appropriate position at least in the direction in which opposite sides are fixed.

Further, for example, as illustrated in the lowermost part of FIG. 14, fixing portions 11-51 and 11-52 may be provided at positions on the spacer 10 corresponding to two opposite sides of the CSP solid-state imaging element 20. In this case, the fixing agent 13 is injected into fixing agents 13-51 and 13-52, for example. In this case, only the two opposite sides of the CSP solid-state imaging element 20 in the vertical direction in FIG. 14 are fixed. However, it is possible to place the CSP solid-state imaging element 20 at an appropriate position at least in the vertical direction in which the opposite sides are fixed.

Specifically, by providing the fixing portions 11 so as to guide at least two opposite sides of the CSP solid-state imaging element 20 having a rectangular shape to appropriate positions, it is possible to improve the accuracy of placing the CSP solid-state imaging element 20.

8. Eighth Embodiment

In the case where it is difficult to obtain, as the fixing agent 13 for fixing the CSP solid-state imaging element 20 and the spacer 10 in the configuration of the CSP solid-state imaging element 20, the fixing agent 13 formed of a light absorbing material such as black resin for suppressing diffused reflection of light according to an embodiment of the present disclosure, diffused reflection of light may be suppressed by performing mask processing of providing the mask 81 formed of a light absorbing material that absorbs light incident on a portion, which is a cause of diffused reflection of light.

Figure 15:
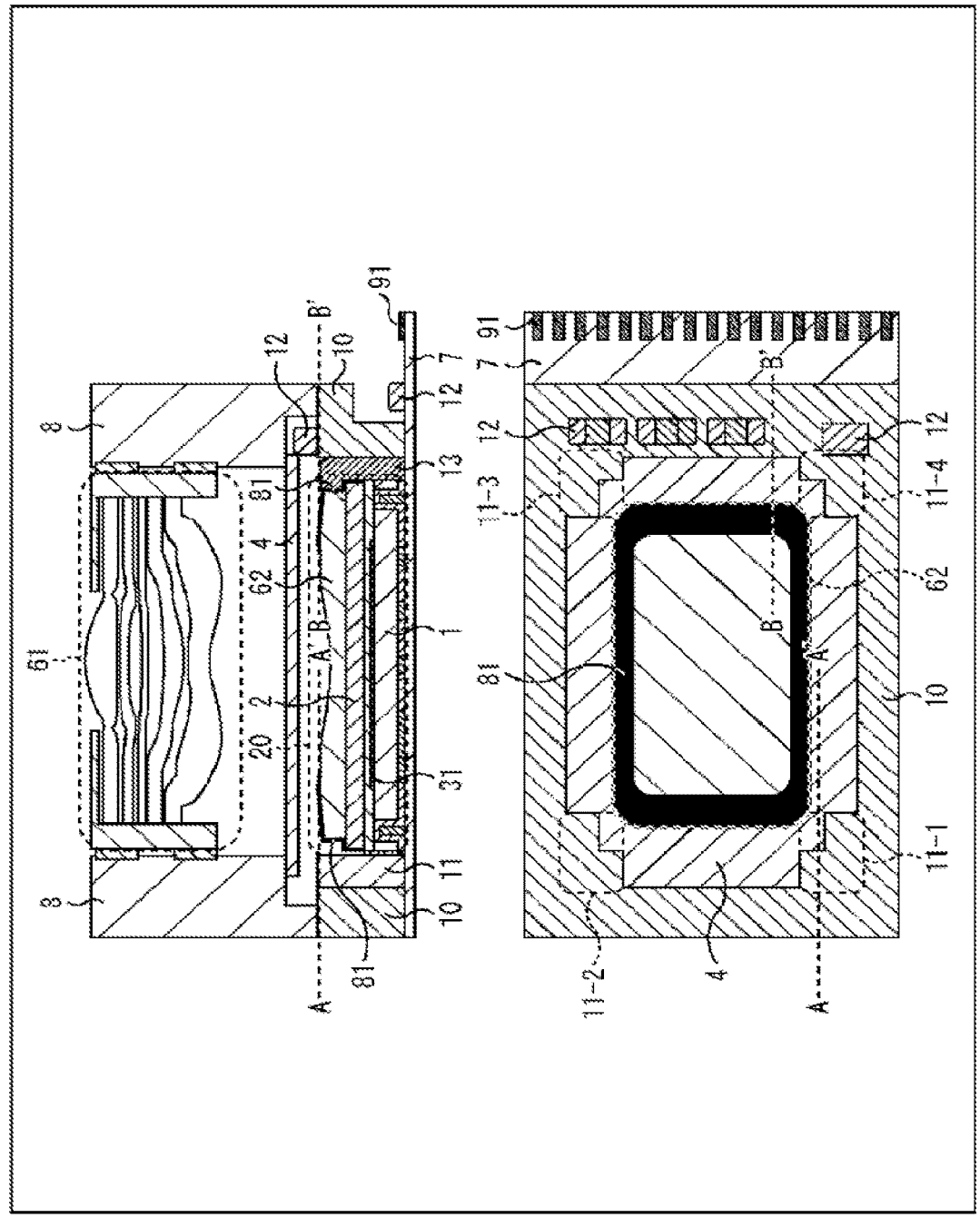
FIG. 15 is a diagram describing a configuration example of an imaging apparatus according to an eighth embodiment of the present disclosure.

FIG. 15 illustrates a configuration example of the imaging apparatus in which diffused reflection of light is suppressed by performing mask processing of providing the mask 81 formed of a light absorbing material that absorbs light incident on a portion, which is a cause of diffused reflection of light.

The mask 81 may be provided by performing mask processing before fixing the CSP solid-state imaging element 20 to the spacer 10. Alternatively, mask processing may be performed after fixing the CSP solid-state imaging element 20 to the spacer 10.

Further, it is desirable that mask processing is performed so that the mask 81 is formed on the entire periphery of the side surface of the CSP solid-state imaging element 20 and on the peripheral portion of the lens 62, e.g., the mask area Z102 illustrated in FIG. 6 so as to cause incident light to enter the effective pixel area.

Further, it is possible to manufacture the CSP solid-state imaging element 20 in efficient processes.

Also with the configuration described above, it is possible to realize a small-sized and thin imaging apparatus having small optical warpage, distortion, and inclination at low cost, and suppress a flare phenomenon due to diffused reflection of light.

9. Ninth Embodiment

In the configuration of the CSP solid-state imaging element 20, the lens 62 in the lowermost layer may be formed to have two or more lenses.

Figure 16:
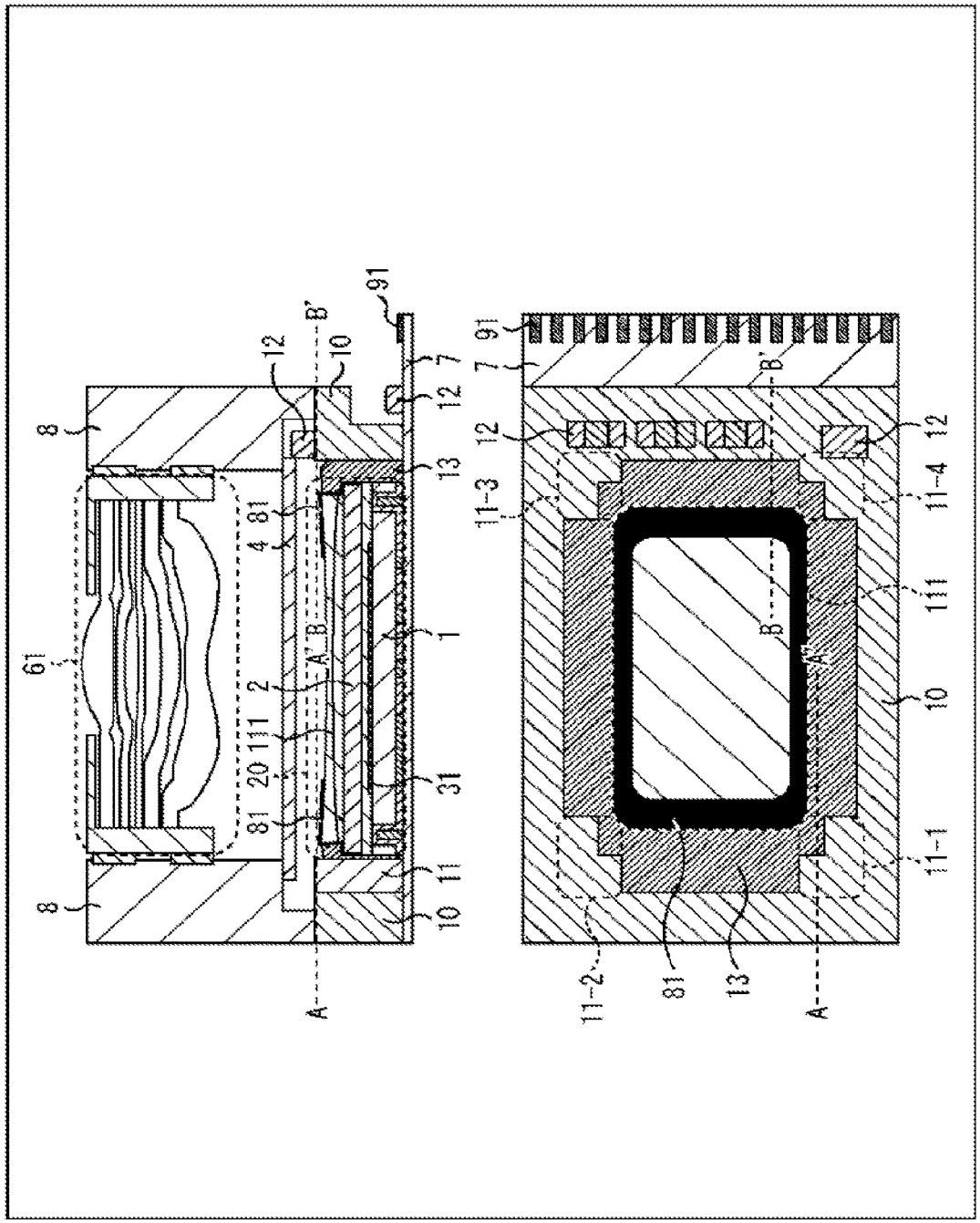
FIG. 16 is a diagram describing a configuration example of an imaging apparatus according to a ninth embodiment of the present disclosure.

FIG. 16 illustrates a configuration example of the CSP solid-state imaging element 20 in which a lens 111 in the lowermost layer is formed to have two or more lenses.

In the case of using a coating apparatus capable of applying the fixing agent 13 formed of a light absorbing material such as black resin or the mask 81 formed of a black light absorbing material to the mask area Z102 (FIG. 5 and FIG. 6) that is a part of the lens 111 in the lowermost layer with high accuracy at the time of production of an imaging apparatus, there is a possibility that the coating apparatus becomes expensive or a high degree of control is necessary.

In the imaging apparatus illustrated in FIG. 16, the mask area Z102 that is the outer peripheral portion of the lens 111 in the lowermost layer is painted black in advance. Accordingly, it is possible to reduce the accuracy of application of the fixing agent 13 formed of black resin or the mask 81 at the time of production of the imaging apparatus. As a result, it is possible to reduce both the apparatus cost and the control cost for the coating apparatus.

Note that the lens 111 in the lowermost layer may be painted black in advance, or the lens 111 in the lowermost layer may be formed in the CSP solid-state imaging element 20 before the lens 111 in the lowermost layer is painted black. Further, the configuration of the lens 111 in the lowermost layer only needs to include one or more lenses, and may, of course, include a lens group consisting of two or more lenses.

However, as illustrated in FIG. 16, in the case where the periphery of the center of the lens 111 is lower than the outer peripheral portion thereof, there is a possibility that the applied fixing agent 13 flows toward the center by the action of gravity before being dried, which may narrow the effective pixel area Z101. In this regard, as illustrated in FIG. 16, in the case where the periphery of the center of the lens 111 is lower than the outer peripheral portion thereof, it is desirable that the mask 81 is formed by performing mask processing on the mask area Z102. Further, as illustrated in FIG. 15, in the case where the outer peripheral portion of the lens 62 is lower than the center thereof, any of the fixing agent 13 and the mask 81 can be used because it is unnecessary to take into account the possibility that the fixing agent 13 flows into the center of the lens 62.

10. Tenth Embodiment

The example in which the CSP solid-state imaging element 20 is used as a configuration of the imaging apparatus has been described above. However, as the configuration of the imaging apparatus exhibiting an effect of suppressing a flare phenomenon that occurs in a lens on the solid-state imaging element, a configuration other than the CSP solid-state imaging element may be used as long as it is a solid-state imaging element. For example, a solid-state imaging element having a flip-chip structure may be used.

Figure 17:
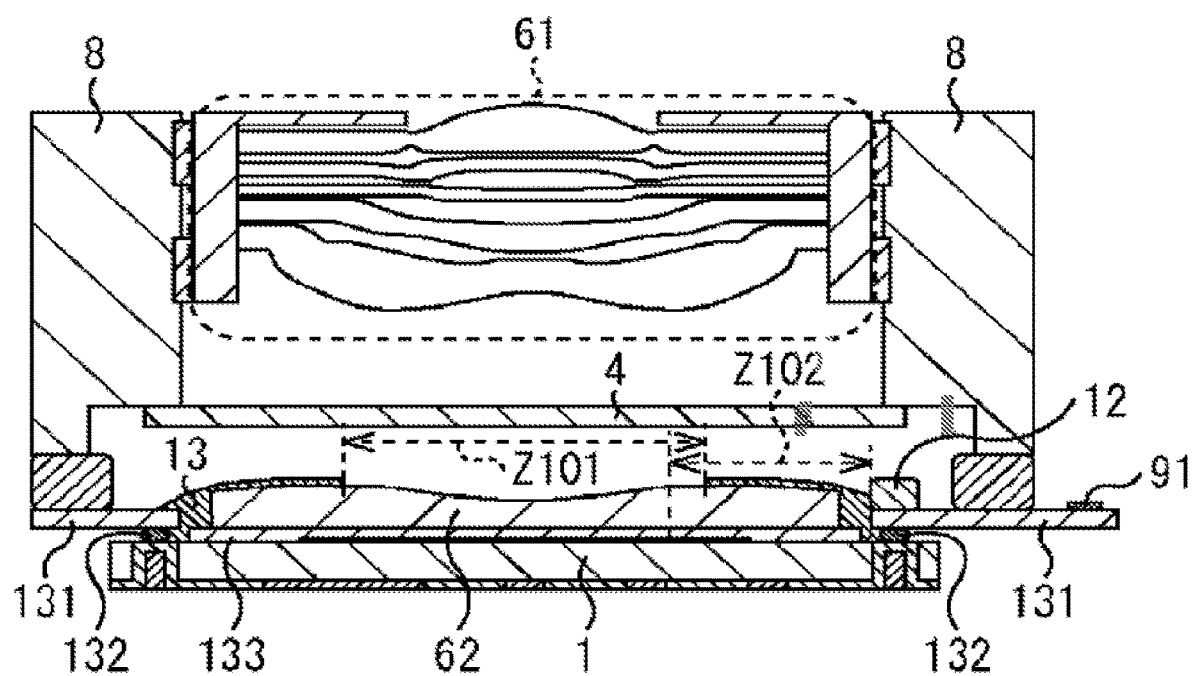
FIG. 17 is a diagram describing a configuration example of an imaging apparatus according to a tenth embodiment of the present disclosure.

FIG. 17 illustrates a configuration example of the imaging apparatus including a flip-chip solid-state imaging element 121 having a flip-chip structure instead of the CSP solid-state imaging element 20. In the imaging apparatus illustrated in FIG. 10, the flip-chip solid-state imaging element 121 and a circuit substrate 131 are connected to each other by a solder 132.

The flip-chip solid-state imaging element 121 is connected to the lens 62 in the lowermost layer that forms a lens group by a transparent resin 133 on the imaging surface thereof. Further, the mask area Z102 is set on the outer peripheral portion of the flip-chip solid-state imaging element 121 and the mask 81 formed of a black light absorbing material is applied thereto so that incident light on the lens 62 in the lowermost layer can enter the entire effective pixel area Z101. In addition, the fixing agent 13 formed of a black light absorbing material is embedded into (applied to) the entire side (periphery of the side surface) to suppress a flare phenomenon due to side light.

That is, the solid-state imaging element in the imaging apparatus according to an embodiment of the present disclosure may have any of a flip-chip structure and a CSP structure. Further, even in the case where the solid-state imaging element has another structure, in all structures, it is possible to suppress a flare phenomenon without depending on the configuration.

According to the present disclosure, it is possible to suppress a flare phenomenon due to diffused reflection of light in a solid-state imaging element formed by using a method for downsizing and thinning. As a result, it is possible to realize a high-performance, small-sized, and thin imaging apparatus capable of achieving favorable image quality.

11. Regarding Configuration of CSP Solid-State Imaging Element

Figure 18:
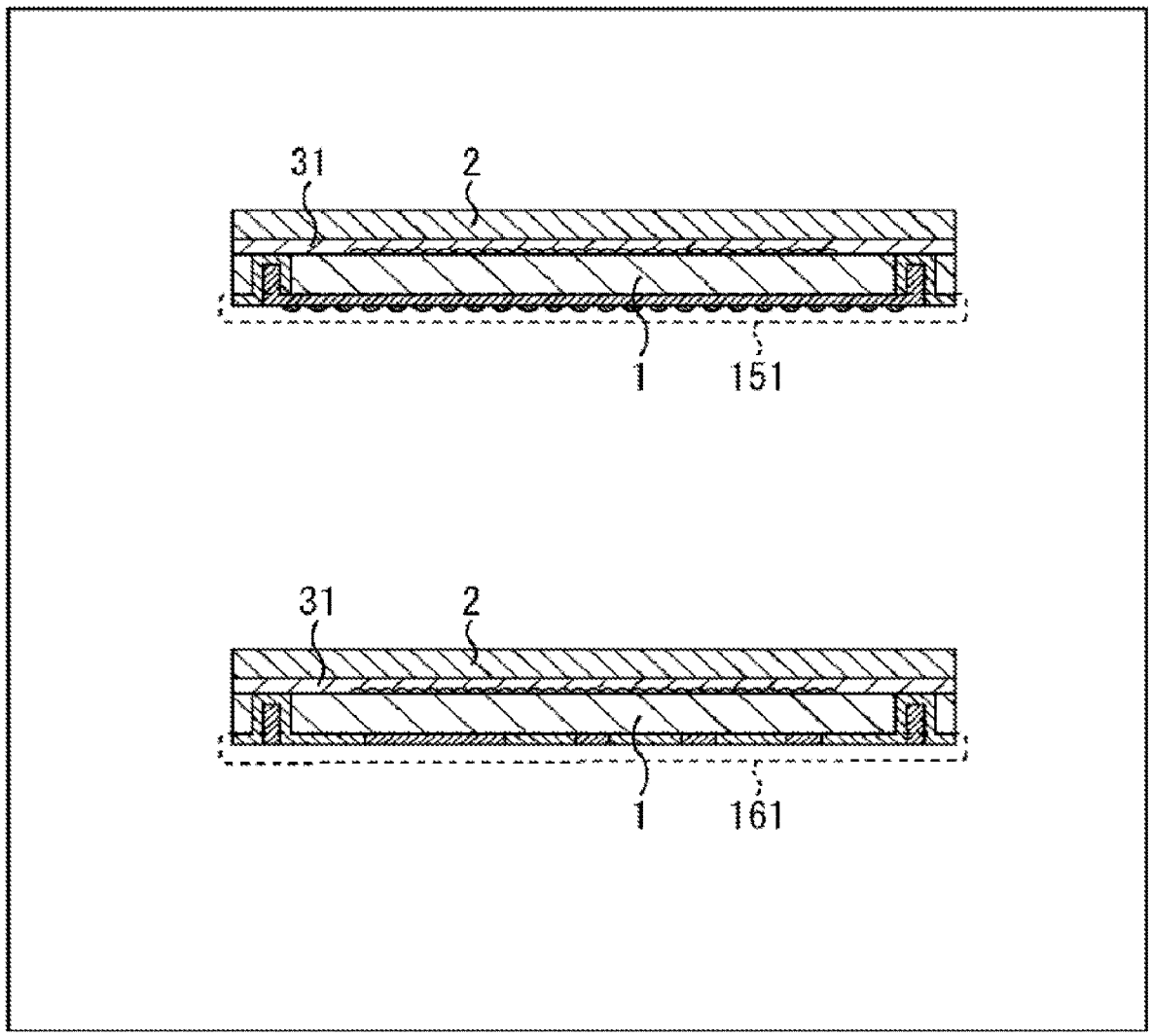
FIG. 18 is a diagram describing a configuration example of a CSP solid-state imaging element according to an embodiment of the present disclosure.

Among the configuration of the CSP solid-state imaging element 20, the connection portion of the circuit substrate 7 may be any of a BGA (Ball Grid Array) terminal 151 illustrated in the upper part of FIG. 18 and a LGA (Land Grid Array) terminal 161 illustrated in the lower part of FIG. 18.

Even with any of the connection portions, it is possible to realize a small-sized and thin imaging apparatus having small optical warpage, distortion, and inclination, and suppress a flare phenomenon due to diffused reflection of light, with the above-mentioned configuration.

12. Application Example to Electronic Apparatus

The above-mentioned imaging element may be applied to, for example, various electronic apparatuses including imaging apparatuses such as digital still cameras and digital video cameras, mobile phones having imaging functions, or other apparatuses having imaging functions.

Figure 19:
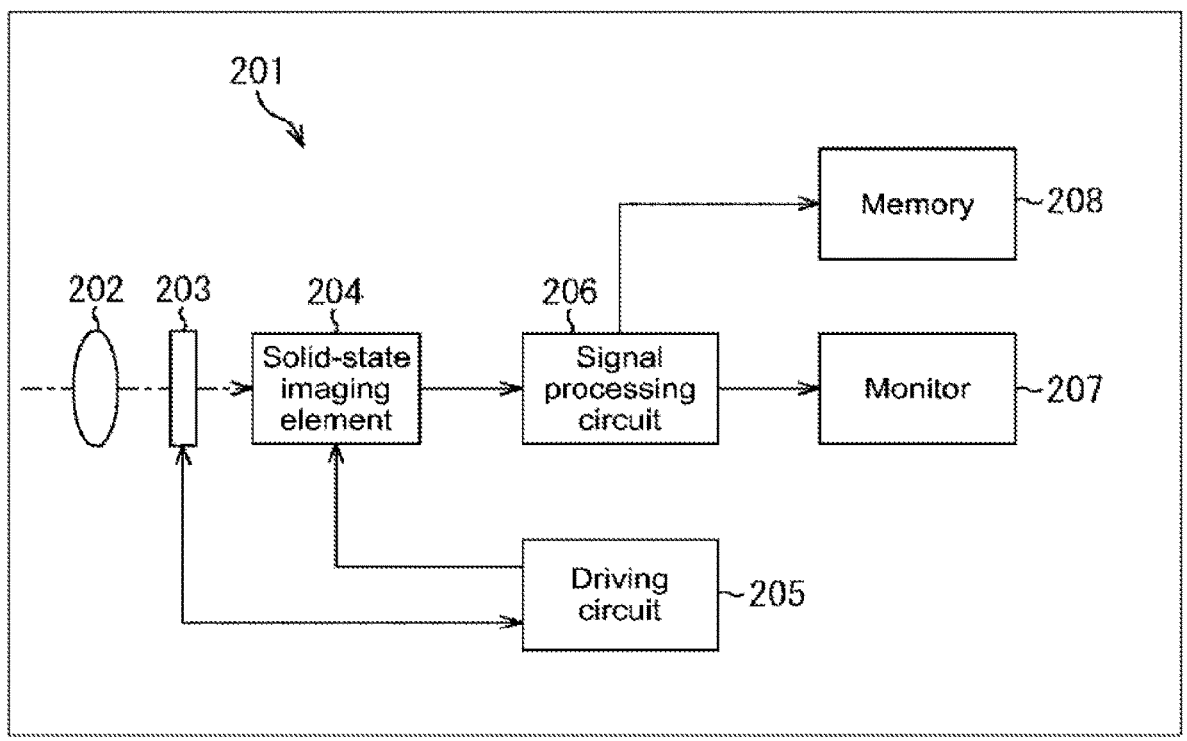
FIG. 19 is a block diagram illustrating a configuration example of an imaging apparatus as an electronic apparatus to which the configuration of the imaging apparatus according to an embodiment of the present disclosure is applied.

FIG. 19 is a block diagram illustrating a configuration example of an imaging apparatus as an electronic apparatus to which an embodiment of the present technology is applied.

An imaging apparatus 201 illustrated in FIG. 19 includes an optical system 202, a shutter apparatus 203, a solid-state imaging element 204, a driving circuit 205, a signal processing circuit 206, a monitor 207, and a memory 208, and is capable of capturing still images and moving images.

The optical system 202 includes one or a plurality of lenses and guides light (incident light) from an object to the solid-state imaging element 204 to form an image on the image receiving surface of the solid-state imaging element 204.

The shutter apparatus 203 is arranged between the optical system 202 and the solid-state imaging element 204 and controls a light irradiation period and a light shielding period to the solid-state imaging element 204 according to the control of the driving circuit 205.

The solid-state imaging element 204 includes a package including the above-mentioned solid-state imaging element. The solid-state imaging element 204 accumulates signal charges for a certain period of time according to the light guided onto the light-receiving surface via the optical system 202 and the shutter apparatus 203. The signal charges accumulated in the solid-state imaging element 204 are transferred according to a driving signal (timing signal) supplied from the driving circuit 205.

The driving circuit 205 outputs driving signals for controlling the transfer operation of the solid-state imaging element 204 and the shutter operation of the shutter apparatus 203 to drive the solid-state imaging element 204 and the shutter apparatus 203.

The signal processing circuit 206 applies various signal processing to signal charges output from the solid-state imaging element 204. An image (image data) obtained when the signal processing circuit 206 applies the signal processing to the pixel signals is supplied to and displayed on the monitor 207 or is supplied to and stored (recorded) in the memory 208.

Also in the imaging apparatus 201 configured as described above, by applying the CSP solid-state imaging element 20 of the above-mentioned imaging apparatus illustrated in FIG. 1, FIG. 5 to FIG. 13, FIG. 15, and FIG. 16 and the flip-chip solid-state imaging element 121 of the imaging apparatus illustrated in FIG. 17 to the optical system 202 and the solid-state imaging element 204, it is possible to prevent (or alternatively, suppress) a flare phenomenon from occurring and achieve favorable image quality.

13. Usage Example of Imaging Element

Figure 20:
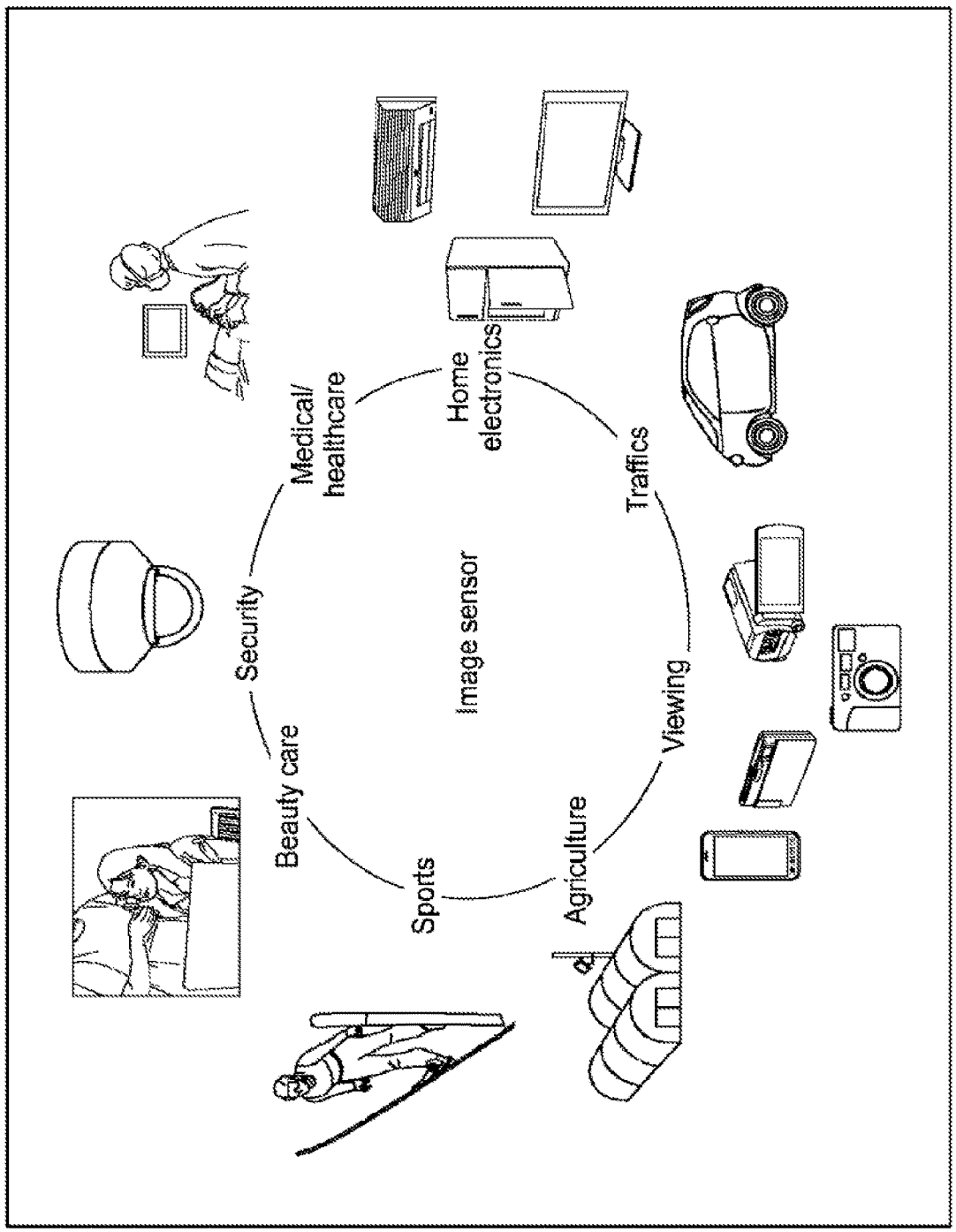
FIG. 20 is a diagram describing a usage example of the imaging apparatus to which the technology according to the present disclosure is applied.

FIG. 20 is a diagram illustrating a usage example of using the above-mentioned imaging apparatus illustrated in FIG. 1, FIG. 5 to FIG. 13, and FIG. 15 to FIG. 17.

The above-mentioned imaging element can be used in various cases of sensing light such as visible light, infrared light, ultraviolet light, and X-rays as follows.

- An apparatus for photographing images to be viewed, such as a digital camera and a camera-equipped mobile apparatus
- An apparatus used for traffic purposes, such as a car-mounted camera that photographs front/rear/periphery/inside of an automobile, a surveillance camera that monitors running vehicles and roads, and a distance measurement sensor that measures distances among vehicles, for safe driving such as automatic stop, recognition of a driver's state, and the like
- An apparatus used in home electronics such as a TV, a refrigerator, and an air conditioner, for photographing gestures of users and executing apparatus operations according to the gestures
- An apparatus used for medical and healthcare purposes, such as an endoscope and an apparatus that performs blood vessel photographing by receiving infrared light
- An apparatus used for security purposes, such as a surveillance camera for crime-prevention purposes and a camera for person authentication purposes
- An apparatus used for beauty care purposes, such as a skin measurement apparatus that photographs skins and a microscope that photographs scalps
- An apparatus used for sports purposes, such as an action camera and a wearable camera for sports purposes
- An apparatus for agriculture purposes, such as a camera for monitoring a state of fields and crops

14. Example of Application to Internal Information Acquisition System

The technology according to the present disclosure (present technology) may be applied to various products. For example, the technology according to the present disclosure may be applied to an endoscopic surgery system.

Figure 21:
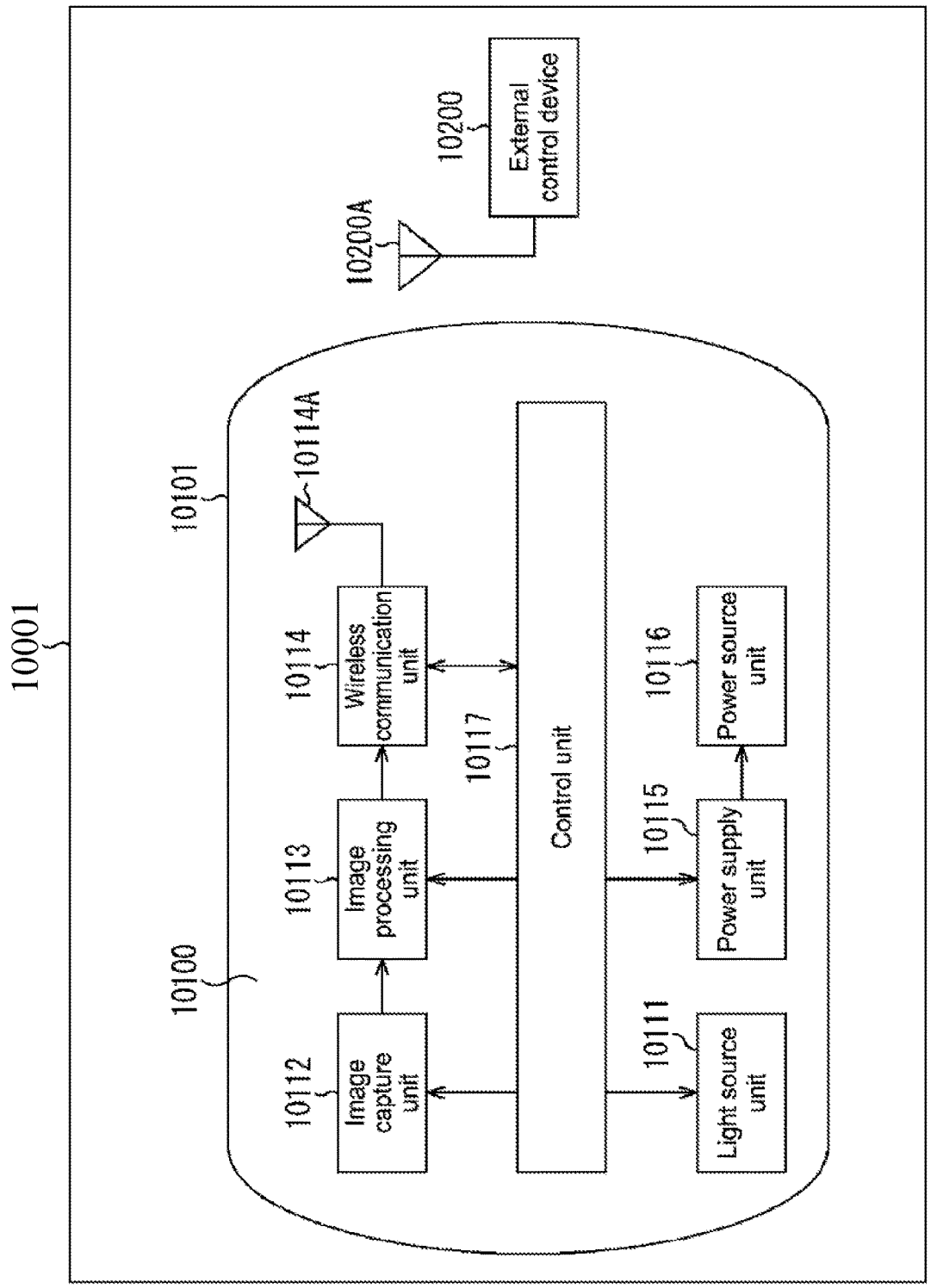
FIG. 21 is a block diagram illustrating an example of a schematic configuration of an internal information acquisition system.

FIG. 21 is a block diagram illustrating an example of a schematic configuration of an internal information acquisition system for a patient, which uses an endoscopic capsule, to which the technology (present technology) according to the present disclosure may be applied.

An internal information acquisition system 10001 includes an endoscopic capsule 10100 and an external control device 10200.

The endoscopic capsule 10100 is swallowed by a patient in an examination. The endoscopic capsule 10100 has an image capture function and a wireless communication function. The endoscopic capsule 10100 moves through the interior of organs such as the stomach and the intestines by peristaltic movement or the like until being excreted naturally from the patient, while also successively capturing images (hereinafter, also referred to as internal images) of the interior of the relevant organs at predetermined intervals, and successively wirelessly transmitting information about the internal images to the external control device 10200 outside the body.

The external control device 10200 centrally controls the operation of the internal information acquisition system 10001. Further, the external control device 10200 receives information about the internal images transmitted from the endoscopic capsule 10100. Based on the received information about the internal images, the external control device 10200 generates image data for displaying the internal images on a display device (not illustrated).

In this way, with the internal information acquisition system 10001, images depicting the patient's internal conditions can be obtained continually from the time the endoscopic capsule 10100 is swallowed to the time the endoscopic capsule 10100 is excreted.

The configurations and functions of the endoscopic capsule 10100 and the external control device 10200 will be described in further detail.

The endoscopic capsule 10100 includes a capsule-shaped housing 10101, and includes a light source unit 10111, an image capture unit 10112, an image processing unit 10113, a wireless communication unit 10114, a power supply unit 10115, a power source unit 10116, and a control unit 10117 built in the capsule-shaped housing 10101.

The light source unit 10111 includes a light source such as a light-emitting diode (LED), for example, and irradiates the imaging field of the image capture unit 10112 with light.

The image capture unit 10112 includes an image sensor, and an optical system made up of multiple lenses provided in front of the image sensor. Reflected light (hereinafter, referred to as observation light) from the light radiated to a body tissue which is an object of observation is condensed by the optical system and incident on the image sensor. The image sensor of the image capture unit 10112 receives and photoelectrically converts the observation light, to thereby generate an image signal corresponding to the observation light. The image signal generated by the image capture unit 10112 is provided to the image processing unit 10113.

The image processing unit 10113 includes a processor such as a central processing unit (CPU) and a graphics processing unit (GPU), and performs various types of signal processing on the image signal generated by the image capture unit 10112. The image processing unit 10113 provides the image signal subjected to the signal processing to the wireless communication unit 10114 as raw data.

The wireless communication unit 10114 performs predetermined processing such as modulation processing on the image signal that was subjected to the signal processing by the image processing unit 10113, and transmits the image signal to the external control device 10200 via an antenna 10114A. In addition, the wireless communication unit 10114 receives, from the external control device 10200 via the antenna 10114A, a control signal related to driving control of the endoscopic capsule 10100. The wireless communication unit 10114 provides control signals received from the external control device 10200 to the control unit 10117.

The power supply unit 10115 includes, for example, an antenna coil for receiving power, a power regeneration circuit for regenerating power from a current produced in the antenna coil, and a voltage step-up circuit. In the power supply unit 10115, the principle of what is called contactless or wireless charging is used for generating power.

The power source unit 10116 includes a secondary battery, and stores power generated by the power supply unit 10115. FIG. 21 omits arrows or the like indicating the recipients of power from the power source unit 10116 for brevity, but power stored in the power source unit 10116 is supplied to the light source unit 10111, the image capture unit 10112, the image processing unit 10113, the wireless communication unit 10114, and the control unit 10117, and may be used for driving these components.

The control unit 10117 includes a processor such as a CPU. The control unit 10117 appropriately controls driving of the light source unit 10111, the image capture unit 10112, the image processing unit 10113, the wireless communication unit 10114, and the power supply unit 10115 in accordance with a control signal transmitted from the external control device 10200.

The external control device 10200 includes a processor such as a CPU and GPU, a microcomputer or a control board on which a processor and a storage element such as a memory are mounted, and the like. The external control device 10200 controls the operation of the endoscopic capsule 10100 by transmitting a control signal to the control unit 10117 of the endoscopic capsule 10100 via an antenna 10200A. In the endoscopic capsule 10100, for example, a light irradiation condition under which the light source unit 10111 irradiates a target of observation with light may be changed by a control signal from the external control device 10200. In addition, an image capture condition (such as the frame rate and the exposure level in the image capture unit 10112) may be changed by a control signal from the external control device 10200. In addition, the content of processing in the image processing unit 10113 and a condition (such as the transmission interval and the number of images to be transmitted) under which the wireless communication unit 10114 transmits the image signal may be changed by a control signal from the external control device 10200.

Moreover, the external control device 10200 performs various types of image processing on the image signal transmitted from the endoscopic capsule 10100, and generates image data for displaying a captured internal image on a display device. For the image processing, various known signal processing, such as a development process (demosaicing process), an image quality-improving process (such as a band enhancement process, a super-resolution process, a noise reduction (NR) process, and/or a shake correction process), and/or an enlargement process (electronic zoom process), may be performed. The external control device 10200 controls driving of a display device (not illustrated), and causes the display device to display a captured internal image on the basis of the generated image data. Alternatively, the external control device 10200 may also cause a recording device (not illustrated) to record the generated image data, or cause a printing device (not illustrated) to make a printout of the generated image data.

The above describes an example of the internal information acquisition system to which the technology according to the present disclosure may be applied. The technology according to the present disclosure may be applied to the image capture unit 10112 of the above-mentioned configurations. Specifically, the CSP solid-state imaging element 20 of the imaging apparatus illustrated in FIG. 1, FIG. 5 to FIG. 13, FIG. 15, and FIG. 16 and the flip-chip solid-state imaging element 121 of the imaging apparatus illustrated in FIG. 17 can be applied as the image capture unit 10112. By applying the technology according to the present disclosure to the image capture unit 10112, it is possible to prevent (or alternatively, suppress) a flare phenomenon from occurring and achieve favorable image quality.

15. Example of Application to Endoscopy Surgery System

The technology according to the present disclosure (present technology) may be applied to various products. For example, the technology according to the present disclosure may be applied to an endoscopy surgery system.

Figure 22:
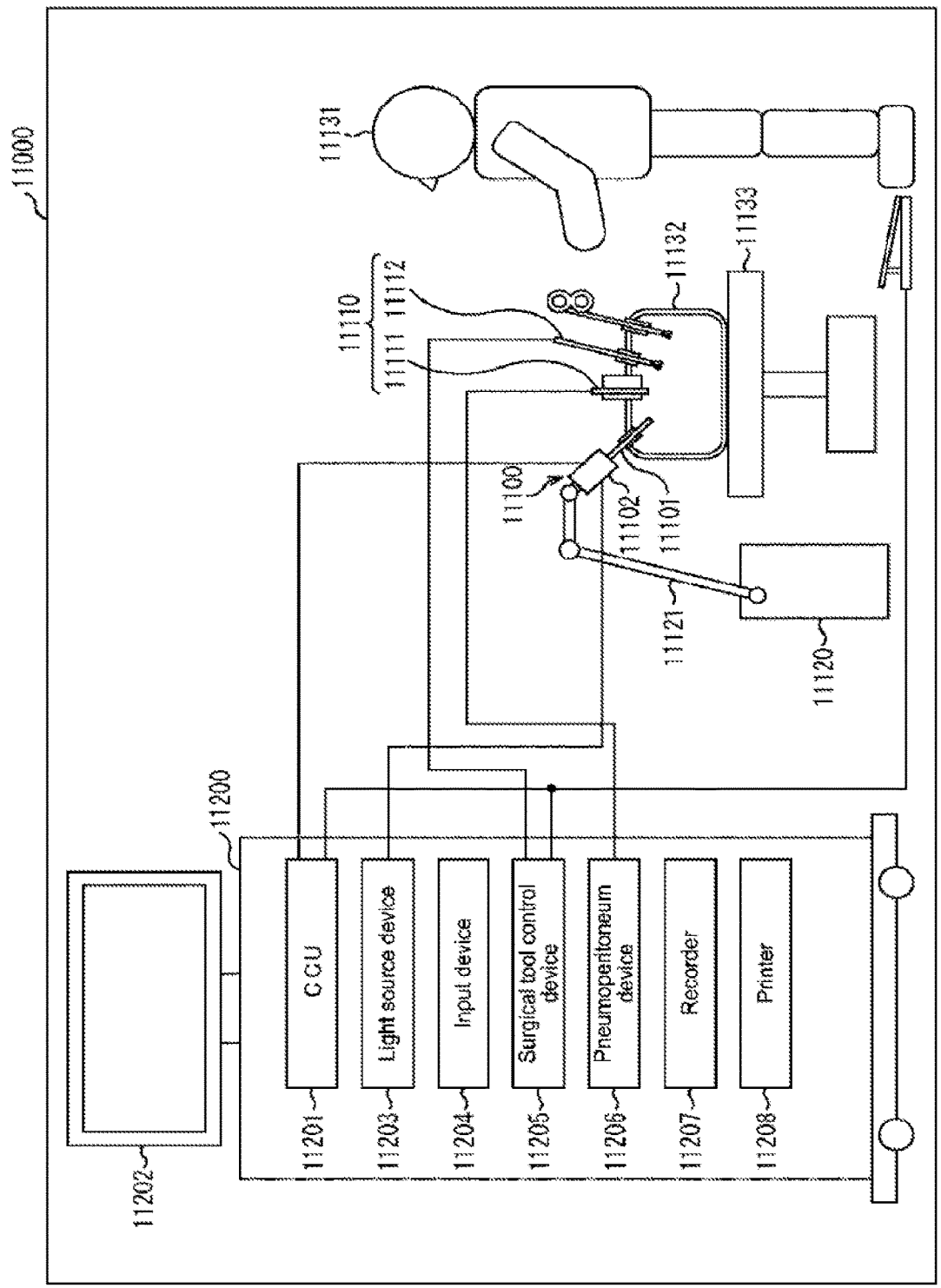
FIG. 22 is a diagram illustrating an example of a schematic configuration of an endoscopy surgery system.

FIG. 22 is a diagram illustrating an example of a schematic configuration of an endoscopy surgery system, to which the technology according to the present disclosure (present technology) may be applied.

FIG. 22 illustrates that a surgeon (doctor) 11131 performs surgery on a patient 11132 on a patient bed 11133 by using an endoscopy surgery system 11000. As illustrated in the figure, the endoscopy surgery system 11000 includes an endoscope 11100, other surgical instruments 11110 such as a pneumoperitoneum tube 11111 and an energy surgical tool 11112, a support arm device 11120 that supports the endoscope 11100, and a cart 11200 including various kinds of built-in endoscopy-surgical devices.

The endoscope 11100 includes a lens tube 11101 and a camera head 11102, part of the lens tube 11101 from the tip having a predetermined length being inserted in the body cavity of the patient 11132, the camera head 11102 being connected to the base of the lens tube 11101. The figure illustrates the endoscope 11100 including the rigid lens tube 11101, i.e., a so-called rigid endoscope, for example. Alternatively, the endoscope 11100 may be a so-called flexible endoscope including a flexible lens tube.

The lens tube 11101 has an opening at the tip, an objective lens being fitted in the opening. A light source device 11203 is connected to the endoscope 11100. The light source device 11203 generates light, a light guide extending in the lens tube 11101 guides the light to the tip of the lens tube, the light passes through the objective lens, and an object of observation in the body cavity of the patient 11132 is irradiated with the light. The endoscope 11100 may be a direct-viewing endoscope, an oblique-viewing endoscope, or a side-viewing endoscope.

The camera head 11102 includes an optical system and an image sensor inside. Reflected light (observation light) from the object of observation is condensed on the image sensor by the optical system. The image sensor photoelectrically converts the observation light to thereby generate an electric signal corresponding to the observation light, i.e., an image signal corresponding to an observation image. The image signal, as raw data, is transmitted to a camera control unit (CCU) 11201.

The CCU 11201 includes a central processing unit (CPU), a graphics processing unit (GPU), or the like, and centrally controls the operation of the endoscope 11100 and a display device 11202. Further, the CCU 11201 receives the image signal from the camera head 11102, and performs various types of image processing, e.g., a development process (demosaicing process) and the like, on the image signal. An image is to be displayed on the basis of the image signal.

Controlled by the CCU 11201, the display device 11202 displays an image on the basis of the image signal subjected to the image processing by the CCU 11201.

The light source device 11203 includes a light source such as a light emitting diode (LED), for example, and supplies light to the endoscope 11100, a surgery site or the like being irradiated with the light when its image is captured.

An input device 11204 is an input interface for the endoscopy surgery system 11000. A user may input various kinds of information and instructions in the endoscopy surgery system 11000 via the input device 11204. For example, a user inputs instructions to change image capture conditions (kind of irradiation light, magnifying power, focal length, and the like) of the endoscope 11100, and other instructions.

A surgical tool control device 11205 controls the driving of the energy surgical tool 11112 that cauterizes a tissue, incises a tissue, seals a blood vessel, or the like. A pneumoperitoneum device 11206 feeds gas into the body cavity via the pneumoperitoneum tube 11111 in order to swell up the body cavity of the patient 11132 for the purpose of securing the imaging field of the endoscope 11100 and securing the workspace for a surgeon. A recorder 11207 is a device capable of recording various kinds of surgical information. A printer 11208 is a device capable of printing the various kinds of surgical information in various kinds of formats such as a text, an image, and a graph.

The light source device 11203, which supplies irradiation light to the endoscope 11100 when an image of a surgery site is captured, may include an LED, a laser light source, or a white light source including a combination of them, for example. Where the white light source includes a combination of RGB laser light sources, the light source device 11203 may adjust the white balance of a captured image since the output intensity and the output timing of each color (each wavelength) may be controlled with a high degree of accuracy. Further, in this case, by irradiating an object of observation with laser lights from the respective RGB laser light sources in time-division and by controlling the driving of the image sensor of the camera head 11102 in synchronization with the irradiation timings, images respectively corresponding to RGB may be captured in time-division. In accordance with this method, the image sensor without color filters may obtain color images.

Further, the driving of the light source device 11203 may be controlled to change the intensity of output light at predetermined time intervals. By controlling the driving of the image sensor of the camera head 11102 in synchronization with the timings of changing the intensity of the light to thereby obtain images in time-division and by combining the images, high-dynamic-range images without so-called black-clipping and white-clipping may be generated.

Further, the light source device 11203 may be configured to be capable of supplying light having a predetermined wavelength band corresponding to special light imaging. An example of the special light imaging is so-called narrow band imaging, which makes use of the fact that absorption of light by a body tissue depends on the wavelength of light. In the narrow band imaging, a body tissue is irradiated with light having a narrower band than the band of irradiation light (i.e., white light) in the normal imaging, and thereby a high-contrast image of a predetermined tissue such as a blood vessel of a mucous membrane surface is captured. Another possible example of the special light imaging is fluorescence imaging, in which a body tissue is irradiated with excitation light, fluorescence is thereby generated, and a fluorescence image is obtained. In the fluorescence imaging, a body tissue is irradiated with excitation light, and fluorescence from the body tissue is imaged (auto-fluorescence imaging). For another possible example, a reagent such as indocyanine green (ICG) is locally injected into a body tissue and, in addition, the body tissue is irradiated with excitation light corresponding to the fluorescence wavelength of the reagent to thereby obtain a fluorescence image. The light source device 11203 may be configured to be capable of supplying narrow band light and/or excitation light corresponding to the special light imaging.

Figure 23:
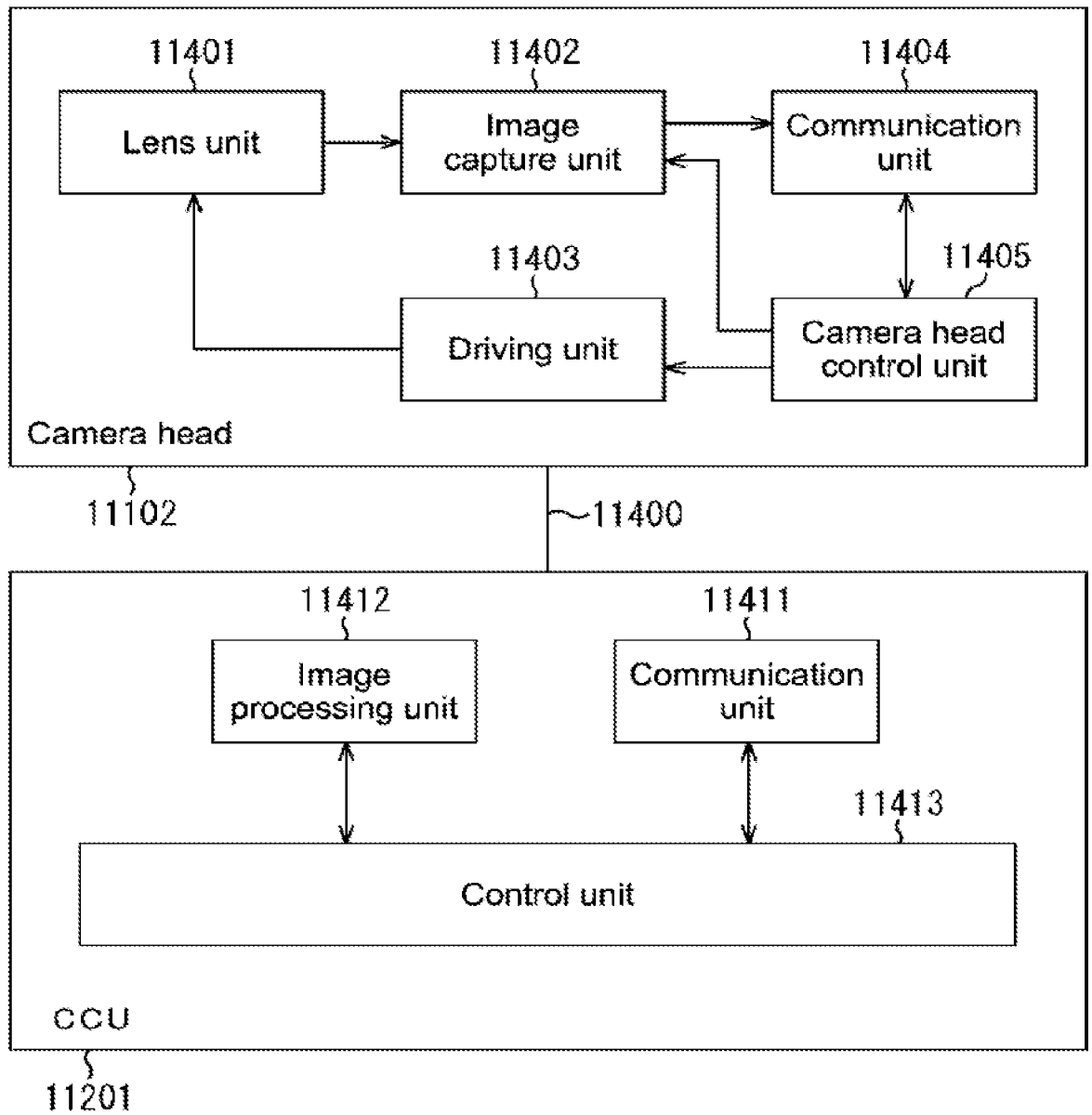
FIG. 23 is a block diagram illustrating an example of a functional configuration of a camera head and a CCU.

FIG. 23 is a block diagram illustrating an example of a functional configuration of the camera head 11102 and the CCU 11201 of FIG. 22.

The camera head 11102 includes a lens unit 11401, an image capture unit 11402, a driving unit 11403, a communication unit 11404, and a camera head control unit 11405. The CCU 11201 includes a communication unit 11411, an image processing unit 11412, and a control unit 11413. The camera head 11102 is connected to the CCU 11201 via a transmission cable 11400, which enables bidirectional communication.

The lens unit 11401 is an optical system provided at a portion of the camera head 11102, to which the lens tube 11101 is connected. Observation light is introduced from the tip of the lens tube 1110, is guided to the camera head 11102, and enters the lens unit 11401. The lens unit 11401 includes a plurality of lenses including a zoom lens and a focal lens in combination.

The image capture unit 11402 includes an image sensor/image sensors. The image capture unit 11402 may include one (i.e., single) image sensor or a plurality of (i.e., multiple) image sensors. Where the image capture unit 11402 includes multiple image sensors, for example, the respective image sensors may generate image signals corresponding to RGB, and a color image may be obtained by combining the RGB image signals. Alternatively, the image capture unit 11402 may include a pair of image sensors for obtaining right-eye and left-eye image signals corresponding to 3D (Dimensional) display. Thanks to the 3D display, the surgeon 11131 is capable of grasping the depth of a biological tissue at a surgery site more accurately. Where the image capture unit 11402 includes multiple image sensors, a plurality of series of lens units 11401 may be provided corresponding to the image sensors, respectively.

Further, the image capture unit 11402 is not necessarily provided in the camera head 11102. For example, the image capture unit 11402 may be provided immediately after the objective lens in the lens tube 11101.

The driving unit 11403 includes an actuator. Controlled by the camera head control unit 11405, the driving unit 11403 causes the zoom lens and the focal lens of the lens unit 11401 to move for a predetermined distance along the optical axis. As a result, the magnifying power and the focus of an image captured by the image capture unit 11402 may be adjusted appropriately.

The communication unit 11404 includes a communication device for transmitting/receiving various kinds of information to/from the CCU 11201. The communication unit 11404 transmits the image signal obtained from the image capture unit 11402 to the CCU 11201 via the transmission cable 11400 as raw data.

Further, the communication unit 11404 receives a control signal related to driving control of the camera head 11102 from the CCU 11201, and supplies the control signal to the camera head control unit 11405. For example, the control signal includes information about image capture conditions, which includes information for specifying the frame rate of a captured image, information for specifying the exposure level when capturing an image, information for specifying the magnifying power and the focus of a captured image, and/or the like.

The above-mentioned image capture conditions such as the frame rate, the exposure level, the magnifying power, and the focus may be specified appropriately by a user, or may be set automatically on the basis of the obtained image signal by the control unit 11413 of the CCU 11201. In the latter case, it is expected that the endoscope 11100 has the so-called AE (Auto Exposure) function, AF (Auto Focus) function, and AWB (Auto White Balance) function.

The camera head control unit 11405 controls the driving of the camera head 11102 on the basis of the control signal received from the CCU 11201 via the communication unit 11404.

The communication unit 11411 includes a communication device for transmitting/receiving various kinds of information to/from the camera head 11102. The communication unit 11411 receives the image signal transmitted from the camera head 11102 via the transmission cable 11400.

Further, the communication unit 11411 transmits the control signal related to driving control of the camera head 11102 to the camera head 11102. The image signal and the control signal may be transmitted via the electric communication, the optical communication, or the like.

The image processing unit 11412 performs various types of image processing on the image signal transmitted from the camera head 11102 as raw data.

The control unit 11413 performs various types of control on capturing an image of a surgery site or the like by the endoscope 11100 and control on displaying the captured image obtained by capturing the surgery site or the like. For example, the control unit 11413 generates a control signal related to driving control of the camera head 11102.

Further, the control unit 11413 causes the display device 11202 to display a captured image of the surgery site or the like on the basis of the image signal subjected to the image processing by the image processing unit 11412. At this time, the control unit 11413 may recognize various kinds of objects in the captured image by making use of various kinds of image recognition techniques. For example, by detecting the edge shape, the color, and the like of an object in the captured image, the control unit 11413 is capable of recognizing a surgical instrument such as forceps, a certain biological site, bleeding, mist generated when using the energy surgical tool 11112, and the like. When the control unit 11413 causes the display device 11202 to display a captured image, the control unit 11413 may display various kinds of surgery assistance information superimposed on the image of the surgery site by making use of the result of the recognition. By displaying the surgery assistance information superimposed on the image, which is presented to the surgeon 11131, it is possible to reduce the burden on the surgeon 11131 and it is possible for the surgeon 11131 to reliably carry on the surgery.

The transmission cable 11400, which connects the camera head 11102 and the CCU 11201, is an electric signal cable that supports electric signal communication, an optical fiber that supports optical communication, or a composite cable of them.

Here, in the illustrated example, wired communication is performed via the transmission cable 11400. Alternatively, communication between the camera head 11102 and the CCU 11201 may be performed wirelessly.

The above describes an example of the endoscopy surgery system to which the technology according to the present disclosure may be applied. The technology according to the present disclosure may be applied to the endoscope 11100 and the image capture unit 11402 of the camera head 11102 of the above-mentioned configuration. Specifically, the CSP solid-state imaging element 20 of the imaging apparatus illustrated in FIG. 1, FIG. 5 to FIG. 13, FIG. 15, and FIG. 16 and the flip-chip solid-state imaging element 121 of the imaging apparatus illustrated in FIG. 17 may be applied to the image capture unit 11402. Where the technology according to the present disclosure is applied to the image capture unit 11402, it is possible to prevent (or alternatively, suppress) a flare phenomenon from occurring and achieve favorable image quality.

Although the above describes the endoscopy surgery system for an example, the technology according to the present disclosure may be applied to another system, e.g., a microscope surgery system or the like.

16. Example of Application to Movable Object

The technology (present technology) according to the present disclosure can be applied to various products. For example, the technology according to the present disclosure may be realized as a device mounted on any kind of movable objects such as a car, an electric car, a hybrid electric car, a motorcycle, a bicycle, a personal mobility, an aircraft, a drone, a ship, and a robot.

Figure 24:
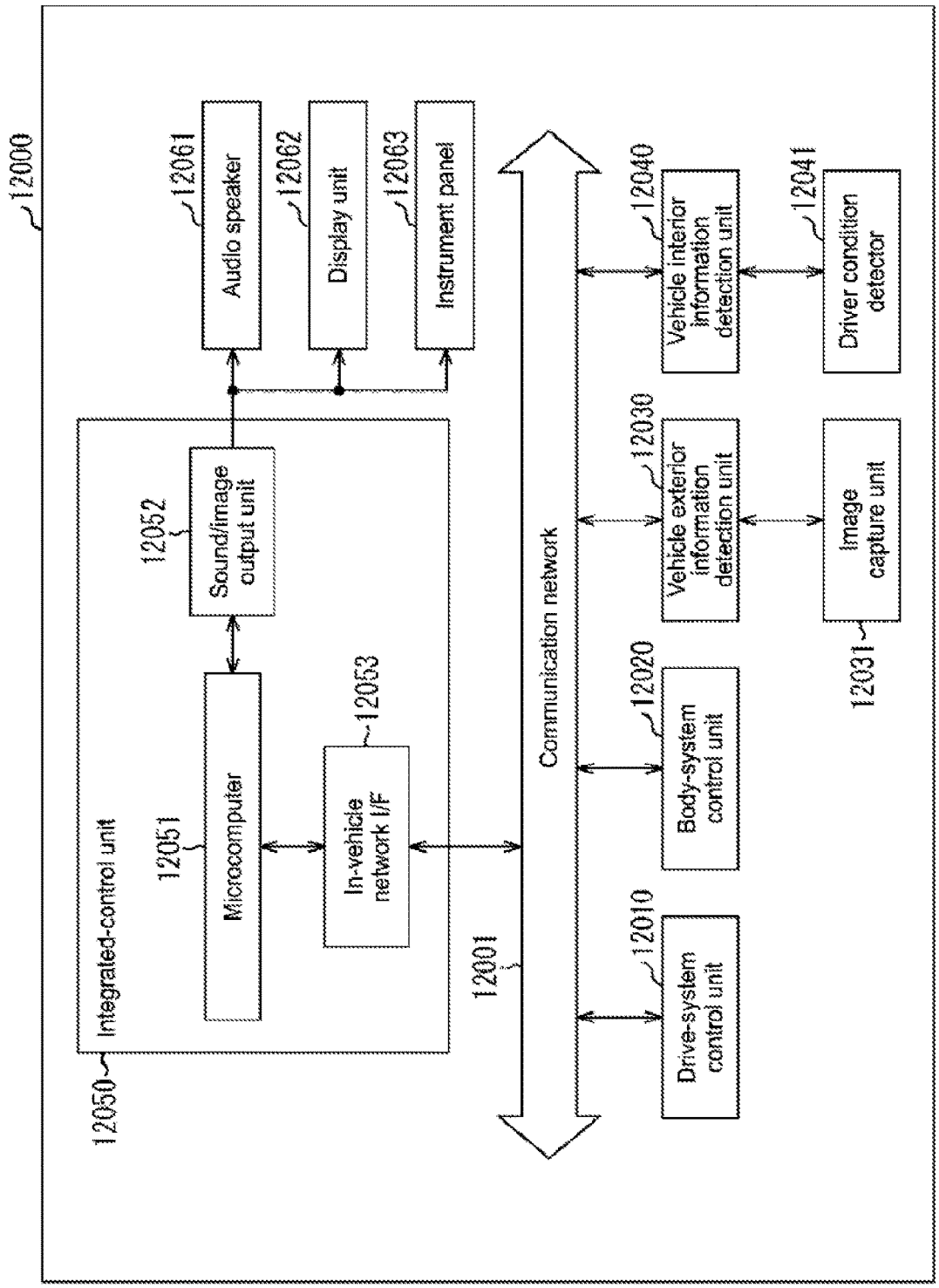
FIG. 24 is a block diagram illustrating an example of a schematic configuration of a vehicle control system.

FIG. 24 is a block diagram illustrating an example of a schematic configuration of a vehicle control system, which is an example of a movable object control system to which the technology according to the present disclosure is applied.

A vehicle control system 12000 includes a plurality of electronic control units connected to each other via a communication network 12001. In the example of FIG. 24, the vehicle control system 12000 includes a drive-system control unit 12010, a body-system control unit 12020, a vehicle exterior information detection unit 12030, a vehicle interior information detection unit 12040, and an integrated-control unit 12050. Further, as the functional configuration of the integrated-control unit 12050, a microcomputer 12051, a sound/image output unit 12052, and an in-vehicle network interface (I/F) 12053 are illustrated.

The drive-system control unit 12010 executes various kinds of programs, to thereby control the operations of the devices related to the drive system of the vehicle. For example, the drive-system control unit 12010 functions as a control device that controls driving force generation devices such as an internal-combustion engine and a driving motor for generating a driving force of the vehicle, a driving force transmission mechanism for transmitting the driving force to wheels, a steering mechanism that adjusts the steering angle of the vehicle, a brake device that generates a braking force of the vehicle, and the like.

The body-system control unit 12020 executes various kinds of programs, to thereby control the operations of the various kinds devices equipped in a vehicle body. For example, the body-system control unit 12020 functions as a control device that controls a keyless entry system, a smart key system, a power window device, or various lamps such as head lamps, back lamps, brake lamps, side-turn lamps, and fog lamps. In this case, an electric wave transmitted from a mobile device in place of a key or signals from various switches may be input in the body-system control unit 12020. The body-system control unit 12020 receives the input electric wave or signal, and controls a door lock device, the power window device, the lamps, and the like of the vehicle.

The vehicle exterior information detection unit 12030 detects information outside the vehicle including the vehicle control system 12000. For example, an image capture unit 12031 is connected to the vehicle exterior information detection unit 12030. The vehicle exterior information detection unit 12030 causes the image capture unit 12031 to capture an environment image and receives the captured image. The vehicle exterior information detection unit 12030 may perform an object detection process of detecting a man, a vehicle, an obstacle, a sign, a signage on a road, or the like on the basis of the received image, or may perform a distance detection process on the basis of the received image.

The image capture unit 12031 is an optical sensor that receives light and outputs an electric signal corresponding to the amount of light received. The image capture unit 12031 may output the electric signal as an image or may output as distance measurement information. Further, the light that the image capture unit 12031 receives may be visible light or invisible light such as infrared light.

The vehicle interior information detection unit 12040 detects vehicle interior information. For example, a driver condition detector 12041 that detects the condition of a driver is connected to the vehicle interior information detection unit 12040. For example, the driver condition detector 12041 may include a camera that captures an image of a driver. The vehicle interior information detection unit 12040 may calculate the fatigue level or the concentration level of the driver on the basis of the detected information input from the driver condition detector 12041, and may determine whether the driver is sleeping.

The microcomputer 12051 may calculate the control target value of the driving force generation device, the steering mechanism, or the brake device on the basis of the vehicle interior/vehicle exterior information obtained by the vehicle exterior information detection unit 12030 or the vehicle interior information detection unit 12040, and may output a control command to the drive-system control unit 12010. For example, the microcomputer 12051 may perform coordinated control for the purpose of realizing the advanced driver assistance system (ADAS) function including avoiding a vehicle collision, lowering impacts of a vehicle collision, follow-up driving based on a distance between vehicles, constant speed driving, vehicle collision warning, a vehicle's lane departure warning, or the like.

Further, by controlling the driving force generation device, the steering mechanism, the brake device, or the like on the basis of information about the environment around the vehicle obtained by the vehicle exterior information detection unit 12030 or the vehicle interior information detection unit 12040, the microcomputer 12051 may perform coordinated control for the purpose of realizing self-driving, i.e., autonomous driving without the need of drivers' operations, and the like.

Further, the microcomputer 12051 may output a control command to the body-system control unit 12020 on the basis of vehicle exterior information obtained by the vehicle exterior information detection unit 12030. For example, the microcomputer 12051 may perform coordinated control including controlling the head lamps on the basis of the location of a leading vehicle or an oncoming vehicle detected by the vehicle exterior information detection unit 12030 and changing high beams to low beams, for example, for the purpose of anti-glare.

The sound/image output unit 12052 transmits at least one of a sound output signal and an image output signal to an output device, which is capable of notifying a passenger of the vehicle or a person outside the vehicle of information visually or auditorily. In the example of FIG. 24, an audio speaker 12061, a display unit 12062, and an instrument panel 12063 are illustrated as examples of the output devices. For example, the display unit 12062 may include at least one of an on-board display and a head-up display.

Figure 25:
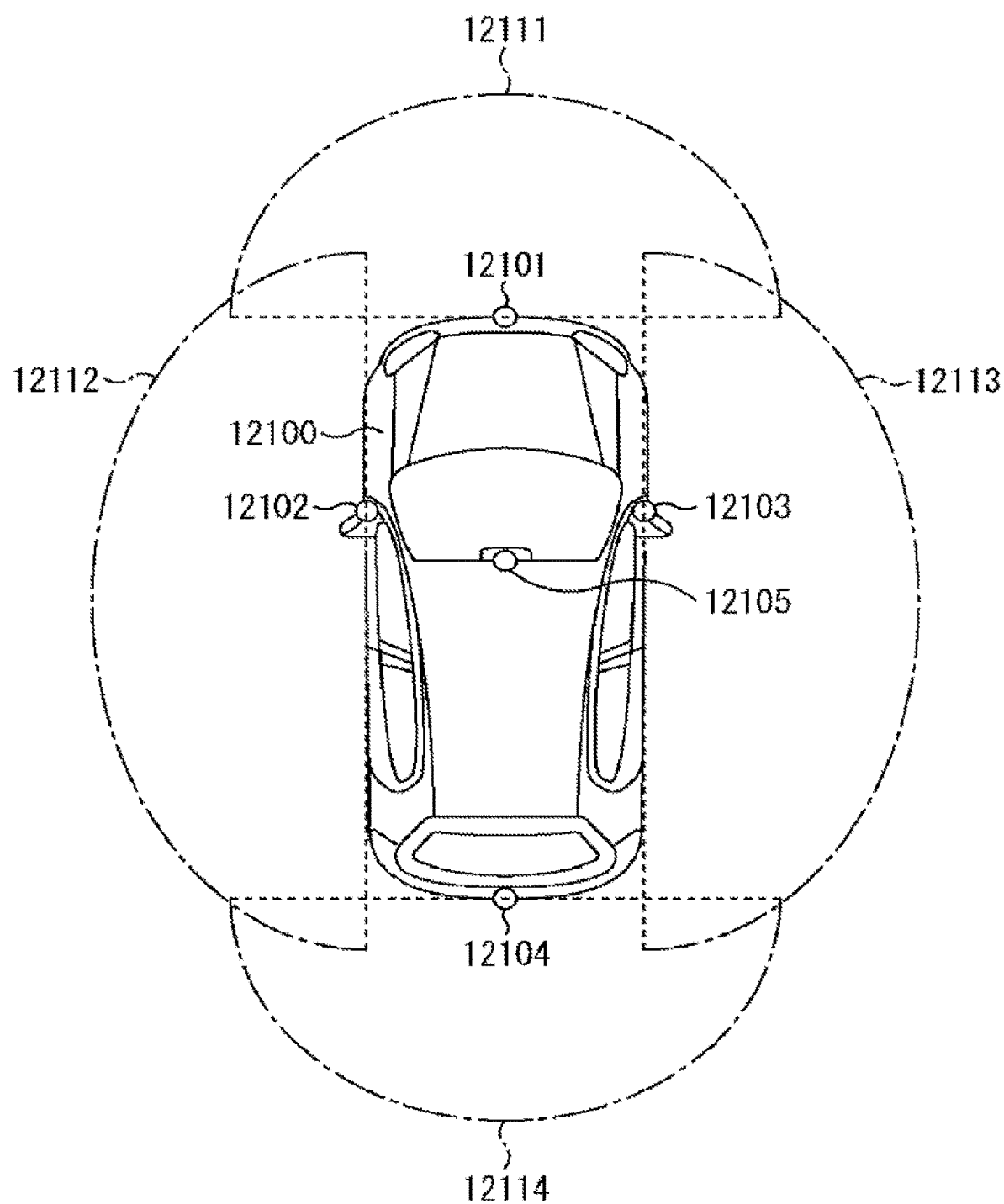
FIG. 25 is an explanatory diagram illustrating examples of mounting positions of a vehicle exterior information detector and image capture units.

FIG. 25 is a diagram illustrating examples of mounting positions of the image capture units 12031.

In FIG. 25, a vehicle 12100 includes, as the image capture units 12031, image capture units 12101, 12102, 12103, 12104, and 12105.

For example, the image capture units 12101, 12102, 12103, 12104, and 12105 are provided at positions such as the front nose, the side-view mirrors, the rear bumper or the rear door, and an upper part of the windshield in the cabin of the vehicle 12100. Each of the image capture unit 12101 on the front nose and the image capture unit 12105 on the upper part of the windshield in the cabin mainly obtains an image of the front of the vehicle 12100. Each of the image capture units 12102 and 12103 on the side-view mirrors mainly obtains an image of a side of the vehicle 12100. The image capture unit 12104 on the rear bumper or the rear door mainly obtains an image of the rear of the vehicle 12100. The images of the front obtained by the image capture units 12101 and 12105 are mainly used for detecting a leading vehicle or detecting a pedestrian, an obstacle, a traffic light, a traffic sign, a lane, or the like.

FIG. 25 illustrates examples of image capture ranges of the image capture units 12101 to 12104. The image capture range 12111 indicates the image capture range of the image capture unit 12101 on the front nose, the image capture ranges 12112 and 12113 indicate the image capture ranges of the image capture units 12102 and 12103 on the side-view mirrors, respectively, and the image capture range 12114 indicates the image capture range of the image capture unit 12104 on the rear bumper or the rear door. For example, by overlaying the image data captured by the image capture units 12101 to 12104 each other, a plane image of the vehicle 12100 as viewed from above is obtained.

At least one of the image capture units 12101 to 12104 may have a function of obtaining distance information. For example, at least one of the image capture units 12101 to 12104 may be a stereo camera including a plurality of image sensors or an image sensor including pixels for phase difference detection.

For example, by obtaining the distance between the vehicle 12100 and each three-dimensional (3D) object in the image capture ranges 12111 to 12114 and the temporal change (relative speed to the vehicle 12100) of the distance on the basis of the distance information obtained from the image capture units 12101 to 12104, the microcomputer 12051 may extract, as a leading vehicle, a 3D object which is especially the closest 3D object driving on the track on which the vehicle 12100 is driving at a predetermined speed (e.g., 0 km/h or more) in the direction substantially the same as the driving direction of the vehicle 12100. Further, by presetting a distance between the vehicle 12100 and a leading vehicle to be secured, the microcomputer 12051 may perform autobrake control (including follow-up stop control), automatic acceleration control (including follow-up start-driving control), and the like. In this way, it is possible to perform coordinated control for the purpose of realizing self-driving, i.e., autonomous driving without the need of drivers' operations, and the like.

For example, the microcomputer 12051 may sort 3D object data of 3D objects into motorcycles, standard-size vehicles, large-size vehicles, pedestrians, and the other 3D objects such as utility poles on the basis of the distance information obtained from the image capture units 12101 to 12104, extract data, and use the data to automatically avoid obstacles. For example, the microcomputer 12051 sorts obstacles around the vehicle 12100 into obstacles that a driver of the vehicle 12100 can see and obstacles that it is difficult for the driver to see. Then, the microcomputer 12051 determines a collision risk, which indicates a hazard level of a collision with each obstacle. When the collision risk is a preset value or more and when there is a possibility of a collision occurrence, the microcomputer 12051 may perform driving assistance to avoid a collision, in which the microcomputer 12051 outputs warning to the driver via the audio speaker 12061 or the display unit 12062, or mandatorily reduces the speed or performs collision-avoidance steering via the drive-system control unit 12010.

At least one of the image capture units 12101 to 12104 may be an infrared camera that detects infrared light. For example, the microcomputer 12051 may recognize a pedestrian by determining whether or not images captured by the image capture units 12101 to 12104 include the pedestrian. The method of recognizing a pedestrian includes, for example, the step of extracting characteristic points in the images captured by the image capture units 12101 to 12104 being infrared cameras, and the step of performing the pattern matching process with respect to a series of characteristic points indicating an outline of an object, to thereby determine whether or not the object is a pedestrian. Where the microcomputer 12051 determines that the images captured by the image capture units 12101 to 12104 include a pedestrian and recognizes the pedestrian, the sound/image output unit 12052 controls the display unit 12062 to display a rectangular contour superimposed on the recognized pedestrian to emphasize the pedestrian. Further, the sound/image output unit 12052 may control the display unit 12062 to display an icon or the like indicating a pedestrian at a desired position.

The above describes an example of the vehicle control system to which the technology according to the present disclosure may be applied. The technology according to the present disclosure may be applied to the image capture unit 12031 of the above-mentioned configurations. Specifically, the CSP solid-state imaging element 20 of the imaging apparatus illustrated in FIG. 1, FIG. 5 to FIG. 13, FIG. 15, and FIG. 16 and the flip-chip solid-state imaging element 121 of the imaging apparatus illustrated in FIG. 17 can be applied as the image capture unit 12031. By applying the technology according to the present disclosure to the image capture unit 12031, it is possible to prevent (or alternatively, suppress) a flare phenomenon from occurring and achieve favorable image quality.

It should be noted that the present technology can also take the following configurations.

<1>

An imaging apparatus, including:

a CSP (Chip Size Package) solid-state imaging element including a solid-state imaging element configured to photoelectrically convert received light into an electric signal corresponding to an amount of the received light, and a glass substrate configured to fix the solid-state imaging element, the solid-state imaging element and the glass substrate being integrated;

a circuit substrate including a circuit configured to externally transfer the photoelectrically converted electric signal;

a spacer for fixing the CSP solid-state imaging element and the circuit substrate;

a fixing portion configured to guide the CSP solid-state imaging element to a predetermined position on the circuit substrate in a case of mounting the CSP solid-state imaging element; and a light absorbing material having a function of absorbing light, the light absorbing material being provided to cover a side surface of the CSP solid-state imaging element.

<2>

The imaging apparatus according to <1> above, in which the CSP solid-state imaging element further includes a lower layer lens that is a part of a lens group including a plurality of lenses configured to condense the received light, the lower layer lens being placed at a position in front of the solid-state imaging element, the position being closer to the solid-state imaging element than an upper layer lens that is a different part of the lens group.

<3>

The imaging apparatus according to <2> above, in which the light absorbing material is further provided to cover an outer peripheral portion of the lower layer lens within a range in which no incident light that enters an effective pixel area of the CSP solid-state imaging element among light that is transmitted through the lower layer lens is blocked.

<4>

The imaging apparatus according to <2> above, in which the light absorbing material is a fixing agent having a function of absorbing light, the fixing agent fixing the CSP solid-state imaging element and the spacer.

<5>

The imaging apparatus according to <1> above, in which the light absorbing material is a mask having a function of absorbing light, the mask being formed by performing mask processing.

<6>

The imaging apparatus according to <1> above, in which the light absorbing material is a fixing agent having a function of absorbing light and a mask having a function of absorbing light, the fixing agent fixing the CSP solid-state imaging element and the spacer, the mask being formed by performing mask processing.

<7>

The imaging apparatus according to <1> above, in which the CSP solid-state imaging element further includes an infrared cut filter configured to cut infrared light from the received light, the solid-state imaging element and the glass substrate are adhered to each other by a transparent adhesive, the glass substrate and the infrared cut filter are adhered to each other by a transparent adhesive, and the lower layer lens is placed on at least one of the infrared cut filter and the glass substrate.

<8>

The imaging apparatus according to <1> above, in which a material for forming the circuit substrate has a linear expansion coefficient close to a linear expansion coefficient of the solid-state imaging element.

<9>

The imaging apparatus according to <1> above, in which the fixing portion is further configured to guide at least two sides of the solid-state imaging element having a rectangular shape to predetermined positions on the circuit substrate.

<10>

The imaging apparatus according to <1> above, in which the fixing portion is further configured to guide four corners of the solid-state imaging element having a rectangular shape to predetermined positions on the circuit substrate.

<11>

The imaging apparatus according to <1> above, in which the CSP solid-state imaging element further includes an infrared cut filter configured to cut infrared light from the received light, and the infrared cut filter is placed between the glass substrate and the solid-state imaging element.

<12>

The imaging apparatus according to <1> above, further including:

an upper layer lens of a lens group configured to condense the received light; and a focusing portion configured to focus the received light to a predetermined position by the upper layer lens.

<13>

The imaging apparatus according to <12> above, in which the focusing portion includes an actuator configured to perform adjustment such that the received light is focused to the predetermined position by driving the upper layer lens.

<14>

The imaging apparatus according to <13> above, in which the actuator has at least one of a function of focusing the received light and a shake correction function by driving the upper layer lens.

<15>

The imaging apparatus according to <1> above, in which the glass substrate has a function as an infrared cut filter having small warpage and distortion.

<16>

The imaging apparatus according to <15> above, in which the glass substrate is formed of soda-lime glass.

<17>

The imaging apparatus according to <1> above, further including:

an upper layer lens that is a part of a lens group configured to condense the received light; and an infrared cut filter configured to cut infrared light from the received light, in which the infrared cut filter is separate from the CSP solid-state imaging element, and placed between the upper layer lens and the solid-state imaging element.

<18>

The imaging apparatus according to <1> above, in which the circuit substrate includes one of a connector configured to externally output a pixel signal output from the solid-state imaging element, and an ACF (Anisotropic Conductive Film) terminal.

<19>

A manufacturing method for an imaging apparatus including a CSP solid-state imaging element including a solid-state imaging element configured to photoelectrically convert received light into an electric signal corresponding to an amount of the received light, and a glass substrate configured to fix the solid-state imaging element, the solid-state imaging element and the glass substrate being integrated, a circuit substrate including a circuit configured to externally transfer the photoelectrically converted electric signal, a spacer for fixing the CSP solid-state imaging element and the circuit substrate, a fixing portion configured to guide the CSP solid-state imaging element to a predetermined position on the circuit substrate in a case of mounting the CSP solid-state imaging element, and a light absorbing material having a function of absorbing light, the light absorbing material being provided to cover a side surface of the CSP solid-state imaging element, the spacer including the fixing portion, the manufacturing method including: fixing the CSP solid-state imaging element to the circuit substrate;

fixing the spacer to the circuit substrate by fitting the CSP solid-state imaging element into the fixing portion of the spacer, the CSP solid-state imaging element being guided to a predetermined position on the circuit substrate; and providing the light absorbing material to cover a side surface of the CSP solid-state imaging element.

<20>

An electronic apparatus, including:

a CSP solid-state imaging element including a solid-state imaging element configured to photoelectrically convert received light into an electric signal corresponding to an amount of the received light, and a glass substrate configured to fix the solid-state imaging element, the solid-state imaging element and the glass substrate being integrated;

a circuit substrate including a circuit configured to externally transfer the photoelectrically converted electric signal;

a spacer for fixing the CSP solid-state imaging element and the circuit substrate;

a fixing portion configured to guide the CSP solid-state imaging element to a predetermined position on the circuit substrate in a case of mounting the CSP solid-state imaging element; and a light absorbing material having a function of absorbing light, the light absorbing material being provided to cover a side surface of the CSP solid-state imaging element.

<21>

An imaging apparatus, comprising:

an imaging structure including:

an imaging element; and a transparent substrate disposed on the imaging element;

a circuit substrate including a circuit;

a spacer including at least one fixing portion that guides the imaging structure to a desired position on the circuit substrate when the imaging structure is mounted on the circuit substrate; and a light absorbing material disposed on at least one side surface of the imaging structure such that that light absorbing material is between the imaging structure and the at least one fixing portion.

<22>
The imaging apparatus according to <21>, wherein the imaging structure further comprises:
a lens stack including a plurality of lenses; and
at least one lens on the transparent substrate and spaced apart from the lens stack,
wherein the lens stack and the at least one lens focus received light.

<23>
The imaging apparatus according to one or more of <21> to <22>, wherein the light absorbing material is disposed on at least one side surface of the at least one lens.

<24>
The imaging apparatus according to one or more of <21> to <23>, wherein the light absorbing material is disposed on a first end surface of the at least one lens, wherein the first end surface is opposite to a second end surface of the at least one lens, the second end surface being closer to the transparent substrate than the first end surface.

<25>
The imaging apparatus according to one or more of <21> to <24>, wherein the first end surface of the at least one lens has a concave shape.

<26>
The imaging apparatus according to one or more of <21> to <25>, wherein the light absorbing material includes an adhesive that adheres the imaging structure to the at least one fixing portion.

<27>
The imaging apparatus according to one or more of <21> to <26>, wherein the light absorbing material is disposed on a side surface of the transparent substrate.

<28>
The imaging apparatus according to one or more of <21> to <27>, wherein the light absorbing material is disposed on a first end surface of the transparent substrate, wherein the first end surface is opposite to a second end surface of the transparent substrate, the second end surface being closer to the circuit substrate than the first end surface.

<29>
The imaging apparatus according to one or more of <21> to <28>, wherein the transparent substrate is an infrared cut filter.

<30>
The imaging apparatus according to one or more of <21> to <29>, wherein the imaging structure further comprises:
an infrared cut filter on the transparent substrate.

<31>
The imaging apparatus according to one or more of <21> to <30>, wherein the at least one fixing portion includes four fixing portions that guide the imaging structure to the desired position.

<32>
The imaging apparatus according to one or more of <21> to <31>, wherein the four fixing portions are defined by a cavity in the spacer and have shapes that guide respective corners of the imaging structure to the desired position.

<33>
The imaging apparatus according to one or more of <21> to <32>, wherein the shapes of the four fixing portions and the respective corners have substantially right angles.

<34>
The imaging apparatus according to one or more of <21> to <33>, wherein the at least one side surface of the imaging structure includes side surfaces at locations that correspond to the respective corners, and the light absorbing material is disposed on partial portions of the side surfaces at the locations that correspond to the respective corners.

<35>
The imaging apparatus according to one or more of <21> to <34>, wherein the imaging structure is a cavity structure that includes a cavity between the imaging element and the transparent substrate.

<36>
The imaging apparatus according to one or more of <21> to <35>, wherein the imaging structure is a cavity-less structure that does not include a cavity between the imaging element and the transparent substrate.

<37>
The imaging apparatus according to one or more of <21> to <36>, wherein the light absorbing material is disposed on at least one side surface of the at least one lens.

<38>
The imaging apparatus according to one or more of <21> to <37>, wherein the imaging structure further comprises:
an infrared cut filter disposed between the lens stack and the at least one lens.

<39>
The imaging apparatus according to one or more of <21> to <38>, wherein the circuit substrate includes one of a connector configured to output a pixel signal output from the imaging element, and an ACF (Anisotropic Conductive Film) terminal.

<40>
An electronic apparatus, comprising:
a control unit; and
an imaging apparatus including:
an imaging structure including:
an imaging element; and
a transparent substrate disposed on the imaging element;
a circuit substrate including a circuit;
a spacer including at least one fixing portion that guides the imaging structure to a desired position on the circuit substrate when the imaging structure is mounted on the circuit substrate; and
a light absorbing material disposed on at least one side surface of the imaging structure such that that light absorbing material is between the imaging structure and the at least one fixing portion.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1 solid-state imaging element
2 glass substrate
4 infrared cut filter
6 lens
7 circuit substrate
8 actuator
9 connector
10 spacer
11, 11-1 to 11-4, 11-21 to 11-24, 11-31, 11-32, 11-41 to 11-43, 11-51, 11-52 fixing portion
12 semiconductor component 13, 13-1 to 13-4, 13-21 to 13-24, 13-31, 13-32, 13-41 to 13-43, 13-51, 13-52 fixing agent
31, 32 adhesive
41 glass substrate
61 upper layer lens
62 lower layer lens
81 mask
91 ACF terminal
111 lens
121 flip-chip solid-state imaging element

What is claimed is:

1. An imaging apparatus, comprising:
an imaging structure including:
an imaging element; and
a transparent substrate disposed on the imaging element;
a circuit substrate including a circuit;
a spacer including at least one fixing portion that guides the imaging structure to a desired position on the circuit substrate when the imaging structure is mounted on the circuit substrate;
a semiconductor component provided at a top surface of the spacer at the at least one fixing portion; and
a light absorbing material disposed on at least one side surface of the imaging structure such that that light absorbing material is between the imaging structure and the at least one fixing portion.

2. The imaging apparatus according to claim 1, wherein the imaging structure further comprises:
a lens stack including a plurality of lenses; and
at least one lens on the transparent substrate and spaced apart from the lens stack, wherein the lens stack and the at least one lens focus received light.

3. The imaging apparatus according to claim 2, wherein the light absorbing material is disposed on at least one side surface of the at least one lens.

4. The imaging apparatus according to claim 3, wherein the light absorbing material is disposed on a first end surface of the at least one lens, wherein the first end surface is opposite to a second end surface of the at least one lens, the second end surface being closer to the transparent substrate than the first end surface.

5. The imaging apparatus according to claim 4, wherein the first end surface of the at least one lens has a concave shape.

6. The imaging apparatus according to claim 1, wherein the light absorbing material includes an adhesive that adheres the imaging structure to the at least one fixing portion.

7. The imaging apparatus according to claim 1, wherein the light absorbing material is disposed on a side surface of the transparent substrate.

8. The imaging apparatus according to claim 7, wherein the light absorbing material is disposed on a first end surface of the transparent substrate, wherein the first end surface is opposite to a second end surface of the transparent substrate, the second end surface being closer to the circuit substrate than the first end surface.

9. The imaging apparatus according to claim 1, wherein the transparent substrate is an infrared cut filter.

10. The imaging apparatus according to claim 1, wherein the imaging structure further comprises:
an infrared cut filter on the transparent substrate.

11. The imaging apparatus according to claim 1, wherein the at least one fixing portion includes four fixing portions that guide the imaging structure to the desired position.

12. The imaging apparatus according to claim 11, wherein the four fixing portions are defined by a cavity in the spacer and have shapes that guide respective corners of the imaging structure to the desired position.

13. The imaging apparatus according to claim 12, wherein the shapes of the four fixing portions and the respective corners have substantially right angles.

14. The imaging apparatus according to claim 12, wherein the at least one side surface of the imaging structure includes side surfaces at locations that correspond to the respective corners, and the light absorbing material is disposed on partial portions of the side surfaces at the locations that correspond to the respective corners.

15. The imaging apparatus according to claim 2, wherein the imaging structure is a cavity structure that includes a cavity between the imaging element and the transparent substrate.

16. The imaging apparatus according to claim 2, wherein the imaging structure is a cavity-less structure that does not include a cavity between the imaging element and the transparent substrate.

17. The imaging apparatus according to claim 16, wherein the light absorbing material is disposed on at least one side surface of the at least one lens.

18. The imaging apparatus according to claim 17, wherein the imaging structure further comprises:
an infrared cut filter disposed between the lens stack and the at least one lens.

19. The imaging apparatus according to claim 1, wherein the circuit substrate includes one of a connector configured to output a pixel signal output from the imaging element, and an ACF (Anisotropic Conductive Film) terminal.

20. An electronic apparatus, comprising:
a control unit; and
an imaging apparatus including:
an imaging structure including:
an imaging element; and
a transparent substrate disposed on the imaging element;
a circuit substrate including a circuit;
a spacer including at least one fixing portion that guides the imaging structure to a desired position on the circuit substrate when the imaging structure is mounted on the circuit substrate;
a semiconductor component provided at a top surface of the spacer at the at least one fixing portion; and
a light absorbing material disposed on at least one side surface of the imaging structure such that that light absorbing material is between the imaging structure and the at least one fixing portion.

* * * * *